United States Patent
Yamamoto et al.

(10) Patent No.: US 11,196,404 B2
(45) Date of Patent: Dec. 7, 2021

(54) SURFACE ACOUSTIC WAVE ELEMENT

(71) Applicant: KYOCERA Corporation, Kyoto (JP)

(72) Inventors: Daisuke Yamamoto, Kyoto (JP);
Takehiro Okumichi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 762 days.

(21) Appl. No.: 15/756,033

(22) PCT Filed: Aug. 26, 2016

(86) PCT No.: PCT/JP2016/074970
§ 371 (c)(1),
(2) Date: Feb. 27, 2018

(87) PCT Pub. No.: WO2017/038679
PCT Pub. Date: Mar. 9, 2017

(65) Prior Publication Data
US 2018/0254763 A1    Sep. 6, 2018

(30) Foreign Application Priority Data
Aug. 31, 2015   (JP) .............. JP2015-170430

(51) Int. Cl.
*H03H 9/02* (2006.01)
*H03H 9/25* (2006.01)
(Continued)

(52) U.S. Cl.
CPC .... *H03H 9/02574* (2013.01); *H03H 9/02559* (2013.01); *H03H 9/02866* (2013.01);
(Continued)

(58) Field of Classification Search
CPC ........... H03H 9/02574; H03H 9/02559; H03H 9/02866; H03H 9/14544; H03H 9/205; H03H 9/25; H03H 9/6483
See application file for complete search history.

(56) References Cited

U.S. PATENT DOCUMENTS 5,796,205 A * 8/1998 Nishihara .............. H03H 3/08
310/313 R
2002/0180562 A1  12/2002 Taniguchi
(Continued)

FOREIGN PATENT DOCUMENTS

JP    H7-202631 A    8/1995
JP    H10-093376 A   4/1998
(Continued)

OTHER PUBLICATIONS

English Translation of JP 2005191717 (Year: 2005).*
(Continued)

*Primary Examiner* — Bryan P Gordon
(74) *Attorney, Agent, or Firm* — Procopio Cory Hargreaves and Savitch LLP

(57) ABSTRACT

A SAW element includes a piezoelectric substrate, a support substrate attached to a bottom surface of the piezoelectric substrate, and an IDT electrode on a top surface of the piezoelectric substrate. A resonance frequency and an anti-resonance frequency of a resonator including the IDT electrode are kept between a frequency of a lowest frequency bulk wave spurious and a frequency of a next lowest frequency bulk wave spurious.

18 Claims, 13 Drawing Sheets

(51) Int. Cl.
  *H03H 9/145* (2006.01)
  *H03H 9/205* (2006.01)
  *H03H 9/64* (2006.01)

(52) U.S. Cl.
  CPC ........ *H03H 9/14544* (2013.01); *H03H 9/205* (2013.01); *H03H 9/25* (2013.01); *H03H 9/6483* (2013.01)

(56) References Cited

U.S. PATENT DOCUMENTS

| | | | |
|---|---|---|---|
| 2010/0097161 A1 | 4/2010 | Nakamura et al. | |
| 2012/0194033 A1* | 8/2012 | Tsuda | H03H 9/64 310/313 C |
| 2013/0162368 A1* | 6/2013 | Tsurunari | H03H 9/25 333/133 |
| 2013/0241674 A1 | 9/2013 | Yamazaki et al. | |
| 2014/0113571 A1* | 4/2014 | Fujiwara | H03H 9/6433 455/73 |
| 2014/0145557 A1* | 5/2014 | Tanaka | H03H 9/1071 310/313 D |
| 2014/0203893 A1 | 7/2014 | Kando et al. | |
| 2015/0236238 A1* | 8/2015 | Hamaoka | H01L 41/107 333/193 |
| 2016/0204763 A1* | 7/2016 | Tani | H03H 5/12 333/188 |
| 2016/0261038 A1 | 9/2016 | Tanaka | |
| 2017/0359051 A1* | 12/2017 | Urata | H03H 9/725 |
| 2017/0373669 A1* | 12/2017 | Iwaki | H03H 9/14552 |

FOREIGN PATENT DOCUMENTS

| | | |
|---|---|---|
| JP | H11-17486 A | 1/1999 |
| JP | 2002-314372 A | 10/2002 |
| JP | 2005-191717 A | 7/2005 |
| JP | 2008-131128 A | 6/2008 |
| JP | 2014-160888 A | 9/2014 |
| JP | 2014-229916 A | 12/2014 |
| WO | 2012/090559 A1 | 7/2012 |
| WO | 2013/047433 A1 | 4/2013 |
| WO | 2015/064238 A1 | 5/2015 |

OTHER PUBLICATIONS

International Search Report dated Nov. 15, 2016, issued by Japan Patent Office for International Application No. PCT/JP2016/074970.

\* cited by examiner

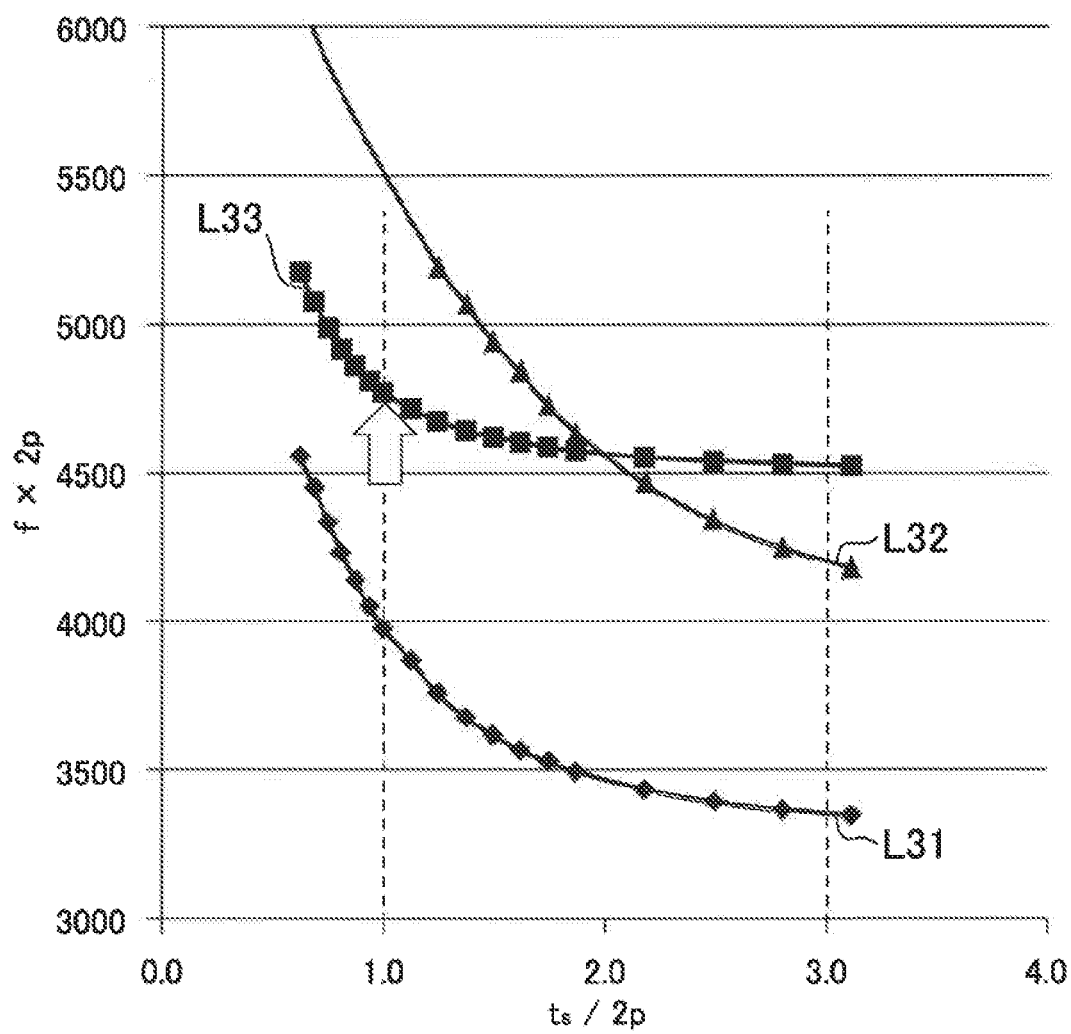

ered to be a bulk wave, not an SAW. Further, the frequency of the spurious differs between the case where the orientation of the SAW element 1 is arranged in the first state and the case where it is arranged in the second state. Therefore, it is confirmed that, at least, the spurious shown in FIG. 3 is generated due to the anisotropy of the piezoelectric substrate 7. Note that, as the spurious generated by the SAW element 1, in addition to the spurious generated by the anisotropy of the piezoelectric substrate 7 shown in FIG. 3, there is one which is generated regardless of the anisotropy of the piezoelectric substrate 7. The latter spurious is observed also between the resonance frequency and the anti-resonance frequency, not at a higher frequency side from the anti-resonance frequency. Accordingly, the cause of the latter spurious is considered to be an SAW different from the bulk wave. Further, the latter spurious appears with a relatively larger interval relative to the frequency width from the resonance frequency up to the anti-resonance frequency. Accordingly, even when a plurality of latter spuriouses are generated, for example, only one or less than that is included between the resonance frequency and the anti-resonance frequency of the resonator 5 concerned.

SURFACE ACOUSTIC WAVE ELEMENT

TECHNICAL FIELD

The present disclosure relates to a surface acoustic wave (SAW) element.

BACKGROUND ART

Known in the art is a SAW element having a piezoelectric substrate and an IDT (interdigital transducer) electrode on a major surface of the piezoelectric substrate (for example Patent Literature 1). Such a SAW element is for example utilized in a receiving filter or transmission filter in a duplexer. In Patent Literature 1, the piezoelectric substrate is not solely used in the SAW element. A bonded substrate formed by bonding together a piezoelectric substrate and a support substrate having a smaller thermal expansion coefficient compared with the piezoelectric substrate is used for the SAW element. By utilizing such a bonded substrate, for example, a change of electrical characteristics of the SAW element due to temperature is compensated for.

Further, Patent Literature 1 discloses that spurious is generated when using a bonded substrate and that the cause of that spurious is a bulk wave. Further, Patent Literature 1 proposes an electrode structure for cancelling bulk waves causing spurious with each other. It is desirable that various techniques be proposed for suppressing spurious caused by bulk waves.

CITATION LIST

Patent Literature

Patent Literature 1: Japanese Patent Publication No. 2014-229916A

SUMMARY OF INVENTION

A surface acoustic wave element according to one aspect of the present disclosure includes a piezoelectric substrate, a support substrate attached to a bottom surface of the piezoelectric substrate, and a first resonator including a first IDT electrode on a top surface of the piezoelectric substrate. A resonance frequency and an anti-resonance frequency of the first resonator are kept between a lowest frequency and a next lowest frequency among frequencies of a plurality of bulk wave spuriouses generated by the first resonator.

A surface acoustic wave element according to another aspect of the present disclosure includes a piezoelectric substrate, a support substrate, and a filter. The support substrate is attached to a bottom surface of the piezoelectric substrate. The filter includes a first IDT electrode. The first IDT electrode is located on a top surface of the piezoelectric substrate. A passband of the filter is kept between a lowest frequency and a next lowest frequency among frequencies of a plurality of bulk wave spuriouses generated by the first IDT electrode.

A surface acoustic wave element according to still another aspect of the present disclosure includes a piezoelectric substrate, a support substrate attached to a bottom surface of the piezoelectric substrate, and a first IDT electrode on a top surface of the piezoelectric substrate. When a pitch of electrode fingers in the IDT electrode is "p" and a thickness of the piezoelectric substrate is $t_s$, a normalized thickness $t_s/2p$ of the piezoelectric substrate is 1 to 3.

BRIEF DESCRIPTION OF DRAWINGS

FIG. 6 Another graph for explaining a method of setting a thickness of a piezoelectric substrate in the SAW element in FIG. 1.

DESCRIPTION OF EMBODIMENTS

Below, a SAW element according to an embodiment of the present disclosure will be explained with reference to the drawings. Note that the drawings used in the following explanation are schematic ones. Dimensions, ratios, etc. on the drawings do not always match realistic ones.

In the SAW element, any direction may be defined as the "upper part" or "lower part". In the following description, however, for convenience, an orthogonal coordinate system comprised of a D1-axis, D2-axis, and D3-axis will be defined, the positive side of the D3-axis will be defined as the "upper part", and the "top surface", "bottom surface", and other terms will be used.

(Outline of Configuration of SAW Element)

Figure 1:
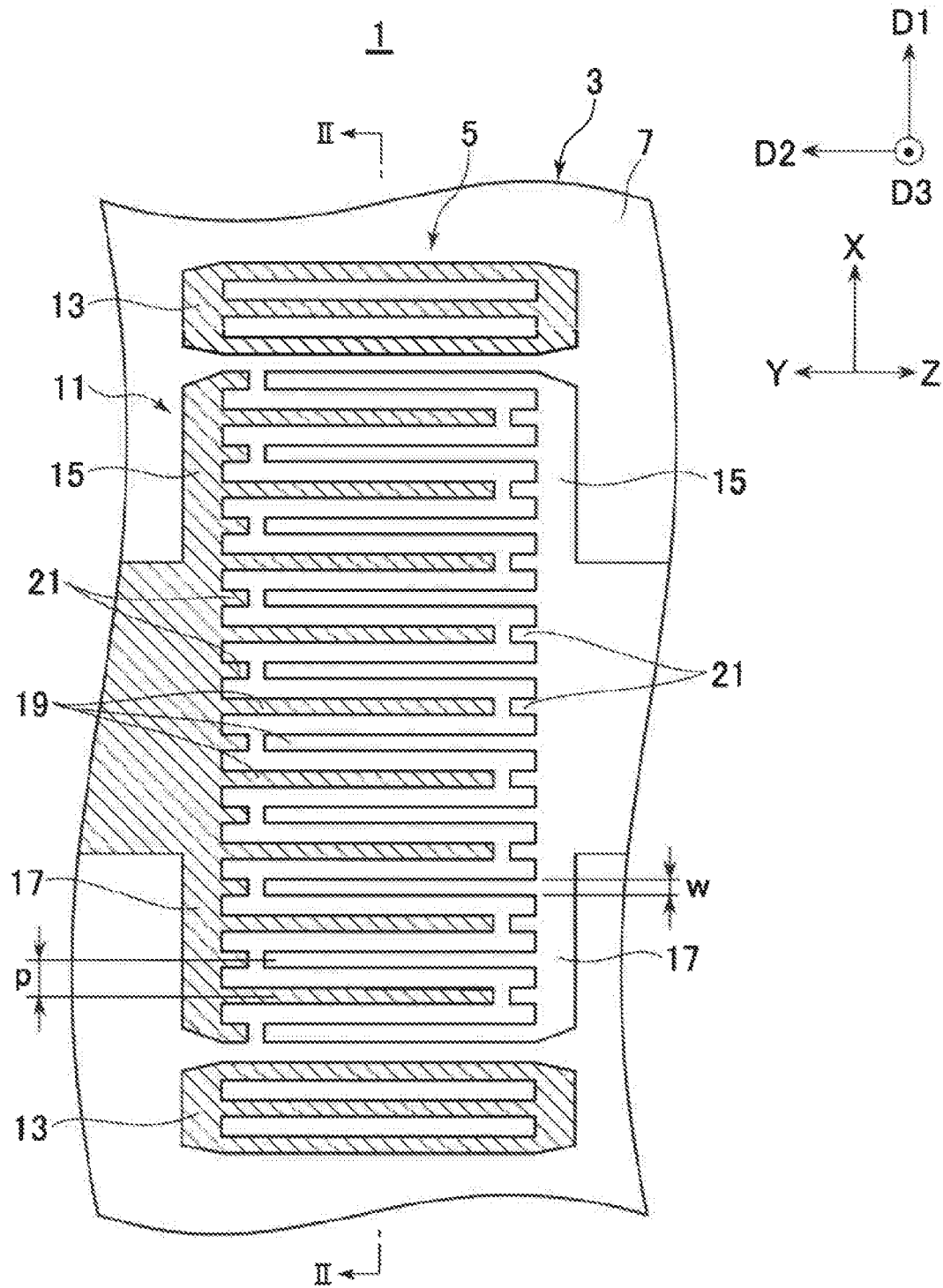
FIG. 1 A plan view showing the configuration of a SAW element according to an embodiment of the present disclosure.
Figure 2:
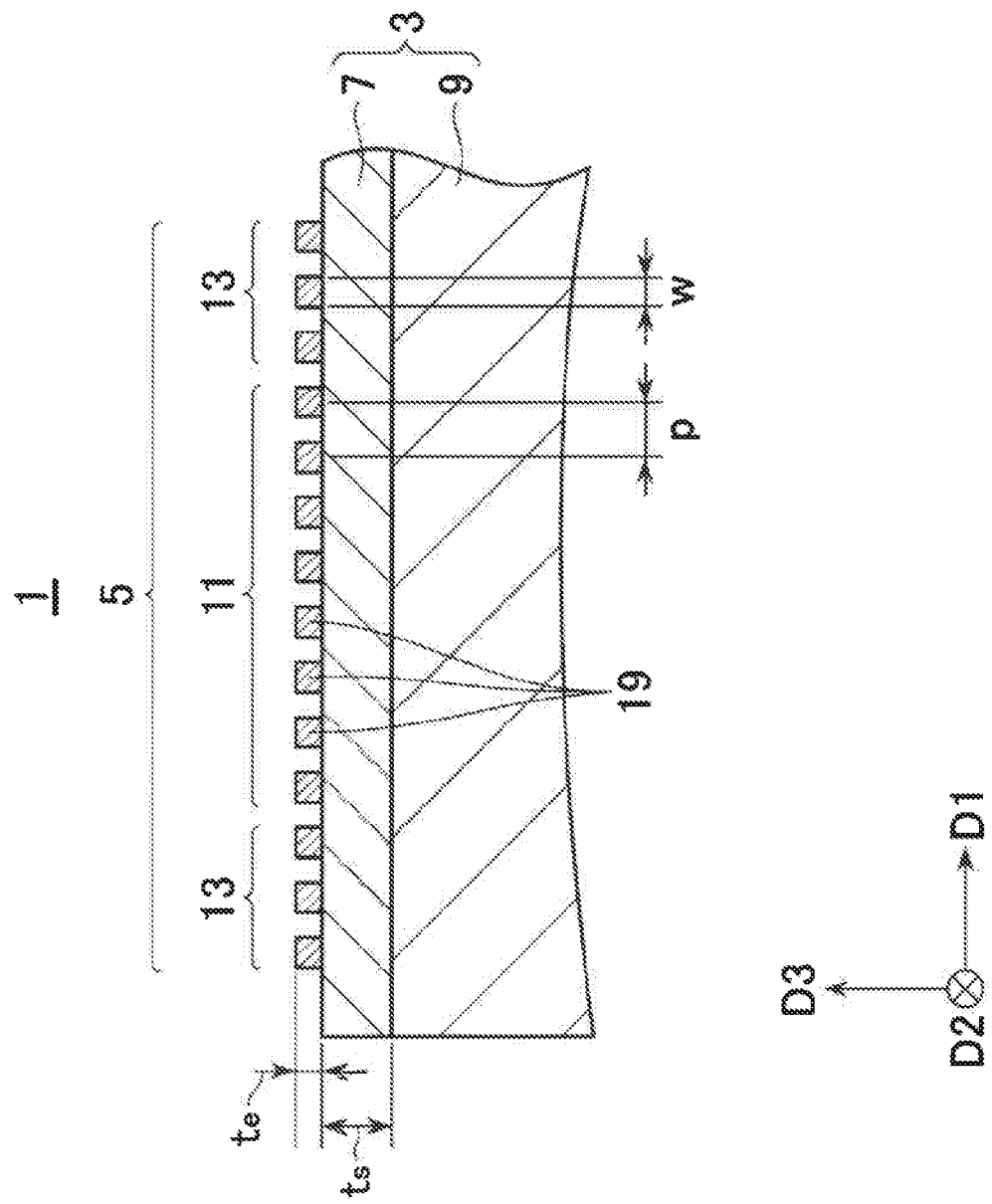
FIG. 2 A cross-sectional view taken along the II-II line in FIG. 1.

FIG. 1 is a plan view showing the configuration of a SAW element 1 according to an embodiment of the present disclosure. FIG. 2 is a cross-sectional view taken along the II-II line in FIG. 1. However, in FIG. 2, the number of the electrode fingers, explained later, is drawn as being smaller than that in FIG. 1.

The SAW element 1 for example has a bonded substrate 3 and a resonator 5 configured on the top surface of the bonded substrate 3. The SAW element 1, other than these, may have a protective layer configured by $SiO_2$ etc. and covering the resonator 5 and so on.

The bonded substrate 3 for example has a piezoelectric substrate 7 and a support substrate 9 (FIG. 2) bonded to the bottom surface of the piezoelectric substrate 7. Note that, FIG. 1 shows an example of the X-axis, Y-axis, and Z-axis of the piezoelectric substrate 7.

The piezoelectric substrate 7 is for example configured by a substrate of a single crystal having piezoelectricity. The substrate of single crystal is for example comprised of lithium tantalate ($LiTaO_3$), lithium niobate ($LiNbO_3$), or quartz crystal ($SiO_2$). The cut angle may be suitably set. For example, the lithium tantalate is a 42°±10° Y-plate or 0°±10° X-plate etc. The lithium niobate may be a 128°±10° Y-plate or 64°±10° Y-plate etc.

Note that, in the following description, an embodiment where the piezoelectric substrate 7 is configured by a 38° to 48° Y-plate made of lithium tantalate will be mainly explained as an example. Unless otherwise indicated, the results of simulation etc. are for a 38° to 48° Y-plate made of lithium tantalite. When describing this for confirmation, in this Y-plate, the major surface is perpendicular to a Y'-axis (not shown) obtained by rotation around the X-axis from the Y-axis to the Z-axis at an angle of 38° to 48°.

The thickness $t_s$ (FIG. 2) of the piezoelectric substrate 7 is for example constant. In the SAW element 1 in the present embodiment, the thickness $t_s$ is set relatively thin. A concrete example of the thickness $t_s$ will be explained later.

The support substrate 9 is for example formed by a material having a smaller thermal expansion coefficient than that of the material for the piezoelectric substrate 7. Due to this, a change of electrical characteristics of the SAW element 1 due to temperature can be compensated for. As such a material, for example there can be mentioned a semiconductor such as silicon, a single crystal of sapphire etc., and a ceramic such as aluminum sintered body. Note that, the support substrate 9 may be configured by lamination of a plurality of layers made of materials which are different from each other as well.

The thickness of the support substrate 9 is for example constant. Further, the size of the support substrate 9 may be suitably set in accordance with specifications etc. which are demanded from the SAW element 1. However, the thickness of the support substrate 9 is made greater than the thickness of the piezoelectric substrate 7 so that temperature compensation is suitably carried out and the strength of the piezoelectric substrate 7 can be reinforced. As an example, the thickness of the support substrate 9 is 100 μm to 300 μm. The planar shape and various dimensions of the support substrate 9 are for example equal to those of the piezoelectric substrate 7.

The piezoelectric substrate 7 and the support substrate 9 are bonded to each other through for example a not shown bonding layer. The material of the bonding layer may be an organic material or may be an inorganic material. As an organic material, for example there can be mentioned a thermosetting resin or other resin. As an inorganic material, for example there can be mentioned $SiO_2$. Further, the piezoelectric substrate 7 and the support substrate 9 may be bonded to each other by so-called direct bonding activating their bonding surfaces by plasma or the like, and then bonding them to each other without a bonding layer.

The resonator 5 is for example configured by a so-called 1-port SAW resonator and has an IDT electrode 11 and a pair of reflectors 13 positioned on the two sides of the IDT electrode 11. The thicknesses $t_e$ (FIG. 2) of the IDT electrode 11 and the reflectors 13 are for example constant.

The IDT electrode 11 is configured by a conductive pattern (conductive layer) on the top surface of the piezoelectric substrate 7 and has a pair of comb-shaped electrodes 15 as shown in FIG. 1.

The pair of comb-shaped electrodes 15 for example have bus bars 17 (FIG. 1) facing each other, pluralities of electrode fingers 19 extending from the bus bars 17 in the facing directions of the bus bars 17, and dummy electrodes 21 projecting from the bus bars 17 between two or more electrode fingers 19. Further, the pair of comb-shaped electrodes 15 are arranged so that the pluralities of electrode fingers 19 intermesh with (cross) each other.

The bus bars 17 are for example substantially formed in long shapes so as to linearly extend in the direction of propagation of the SAW (D1-axis direction, X-axis direction) with constant widths. The bus bars 17 of the pair of comb-shaped electrodes 15 face each other in the direction (D2-axis direction) crossing the direction of propagation of the SAW.

The plurality of electrode fingers 19 are for example substantially formed in long shapes so as to linearly extend in the direction (D2-axis direction) perpendicular to the direction of propagation of SAW with constant width, and are aligned at schematically constant interval in the direction of propagation of SAW (D1-axis direction). The plurality of electrode fingers 19 of the pair of comb-shaped electrodes 15 are provided so that their pitch p (for example distance between the centers of the electrode fingers 19) becomes equal to the semi-wavelength of the wavelength λ of SAW having the frequency at which resonation is demanded. The wavelength λ is for example 1.5 μm or more and 6 μm or less.

The pitch "p" may be made relatively small or conversely may be made relatively large in a portion of the plurality of electrode fingers 19. It is known that the frequency characteristics of the SAW element are improved by providing such a narrow pitch portion or wide pitch portion. Note that, in the present embodiment, when simply referring to the pitch "p" (electrode finger pitch), unless indicated otherwise, it means the pitch "p" of the portion excluding any narrow pitch portion and wide pitch portion (major portion of the plurality of electrode fingers 19) or a mean value thereof. Further, in the same way, when simply referring to an electrode finger 19, unless indicated otherwise, this designates an electrode finger 19 other than those in a narrow pitch portion or wide pitch portion.

The number, length (D2-axis direction), and width "w" (D1-axis direction) of the plurality of electrode fingers 19 may be suitably set in accordance with the electrical characteristics etc. which are demanded from the SAW element 1. As an example, the number of electrode fingers 19 is 100 to 400. The lengths and widths "w" of the electrode fingers 19 are for example equal to each other among the plurality of electrode fingers 19. Note that, w/p will be sometimes referred to as the "duty ratio". In the same way as the pitch "p", when simply referring to the duty ratio, unless indicated otherwise, this means the duty ratio of the portion excluding a special portion such as narrow pitch portion or wide pitch portion (major portion of the plurality of electrode fingers 19) or a mean value thereof.

A dummy electrode 21 for example projects from a bus bar 17 at an intermediate position of two or more electrode fingers 19 in one comb-shaped electrode 15. The tip end thereof faces the tip end of an electrode finger 19 of the other comb-shaped electrode 15 through a gap. The lengths and widths of the dummy electrodes 21 are equal to each other among a plurality of dummy electrodes 21.

A reflector 13 is for example configured by a conductive pattern (conductive layer) on the top surface of the piezoelectric substrate 7 and is formed in a lattice-shape when viewed on a plane. That is, the reflector 13 has a pair of bus bars (notation omitted) which face each other in a direction crossing the direction of propagation of the SAW, and a plurality of strip electrodes (notation is omitted) which extend in the direction (D2-axis direction) perpendicular to the direction of propagation of SAW between these bus bars.

The plurality of strip electrodes in the reflector 13 are aligned in the D1-axis direction so as to follow the array of the plurality of electrode fingers 19. The number and width of the strip electrodes may be suitably set in accordance with the electrical characteristics etc. demanded from the SAW element 1. The pitch of the plurality of strip electrodes is for example equal to the pitch of the plurality of electrode fingers 19. Further, the interval between the strip electrode at the end part of the reflector 13 and the electrode finger 19 at the end part of the IDT electrode 11 is for example equal to the pitch of the plurality of electrode fingers 19.

The conductive layer configuring the IDT electrode 11 and reflectors 13 etc. is for example configured by a metal. As this metal, for example there can be mentioned Al or an alloy containing Al as a principal ingredient (Al alloy). The Al alloy is for example an Al—Cu alloy. Note that, the conductive layer may be configured by a plurality of metal layers. The IDT electrode 11 and/or reflectors 13 may have an insulation layer on the top surface or bottom surface of the conductive layer for the purpose of raising the reflection coefficient of the SAW with respect to the resonator 5.

In the SAW element 1 having the configuration as described above, for example, when an electrical signal is input to one comb-shaped electrode 15 and a voltage is applied to the piezoelectric substrate 7 by the plurality of electrode fingers 19, in the vicinity of the top surface of the piezoelectric substrate 7, a SAW propagating along the top surface is induced. This SAW is reflected by the plurality of electrode fingers 19 and plurality of strip electrodes in the reflectors 13. As a result, a standing wave of a SAW having the pitch "p" of the plurality of electrode fingers 19 as a half wavelength ($\lambda/2$) is formed. The standing wave generates an electrical charge (electrical signal having the same frequency as that of the standing wave) on the top surface of the piezoelectric substrate 7. That electrical signal is taken out by the plurality of electrode fingers 19 of the other comb-shaped electrode 15. By such a mode of operation, the SAW element 1 functions as a resonator or filter.

Generation of Spurious in Comparative Example

As described above, when a voltage is applied to the piezoelectric substrate 7 by the plurality of electrode fingers 19, in the piezoelectric substrate 7, not only a SAW, but also a bulk wave propagating inside the piezoelectric substrate 7 are excited. Patent Literature 1 discloses that the bulk wave becomes the cause of spurious if the piezoelectric substrate is thin like the piezoelectric substrate 7 in the bonded substrate 3.

Figure 3:
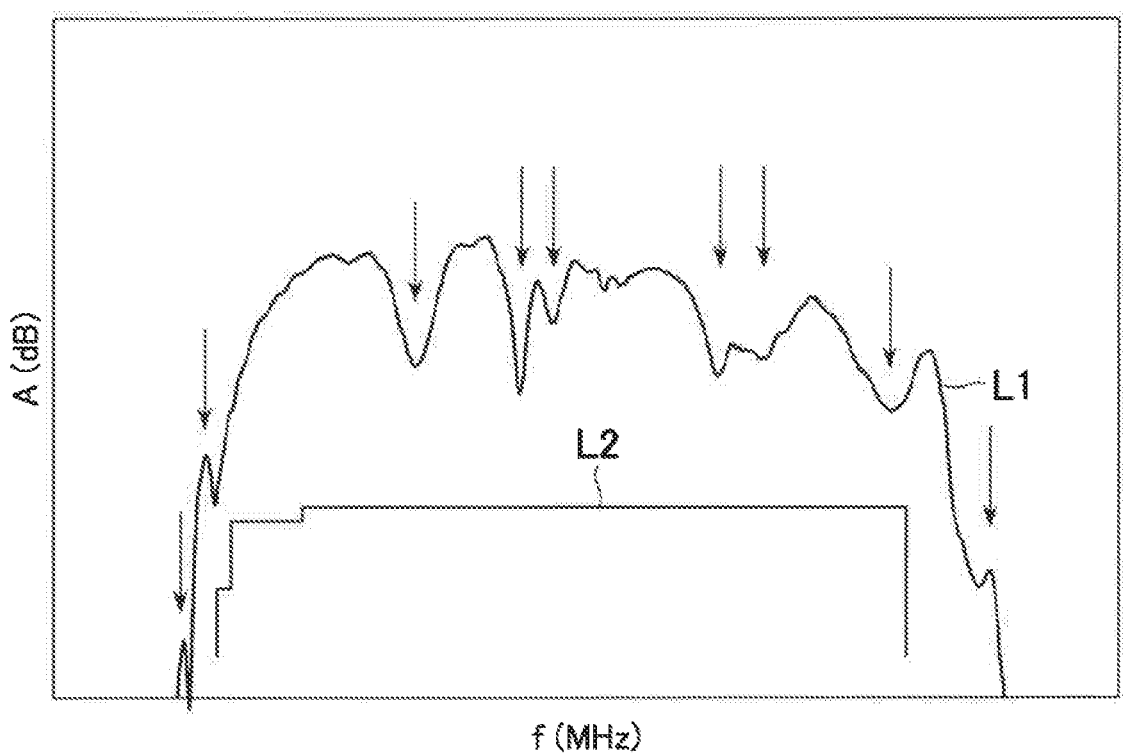
FIG. 3 A graph showing an example of spurious in a comparative example.

FIG. 3 is a graph showing an example of spurious caused by the bulk wave in a comparative example.

In FIG. 3, a SAW filter according to a comparative example is assumed. The SAW filter is for example a ladder type filter and is formed by connecting a plurality of 1-port SAW resonators (see FIG. 1 and FIG. 2) in series or in parallel. Note, in the filter according to the comparative example, the thickness of the piezoelectric substrate 7 is different from that in the present embodiment.

In FIG. 3, an abscissa (f (MHz)) indicates the frequency, and an ordinate (A (dB)) indicates an attenuation amount. Further, a line L1 indicates a propagation characteristic of the SAW filter according to a comparative example, and a line L2 indicates an insertion loss to be guaranteed.

As indicated by the line L1, the attenuation amount is reduced in the frequency band for forming the passband. However, as indicated by a plurality of arrows, at the frequency for forming the passband, a plurality of spuriouses mainly caused by the bulk wave are generated. In the present embodiment, the object is to reduce such spurious. Note that, there are a large number of such spuriouses not only in the frequency range shown in FIG. 3, but also on the low frequency side and high frequency side.

(Summary of Properties of Bulk Wave)

The inventors of the present application engaged in intensive repeated study of such spuriouses and consequently hypothesized that the numerous spuriouses are generated by the following mechanism.

When a voltage is applied to the piezoelectric substrate by the IDT electrode 11, two or more types of bulk waves are generated. Between them, at least one of the modes of vibration direction and modes of order are different from each other. The mode of vibration direction is for example the mode of vibration in the D3-axis direction, the mode of vibration in the D2-axis direction, or the mode of vibration in the D1-axis direction. Each of the modes of vibration direction includes modes of two or more orders. This mode of order is defined according to for example the numbers of nodes and antinodes in the depth direction (D3-axis direction).

Therefore, a plurality of SAW elements 1 given thicknesses $t_s$ of piezoelectric substrate 7 made different from each other were assumed and the influences of thicknesses of the piezoelectric substrates 7 exerted upon the frequency of the bulk wave of each mode were checked. Specifically, by simulation calculations, the frequencies of bulk waves of each mode generated on the piezoelectric substrates 7 having various thicknesses were computed.

Figure 4A:
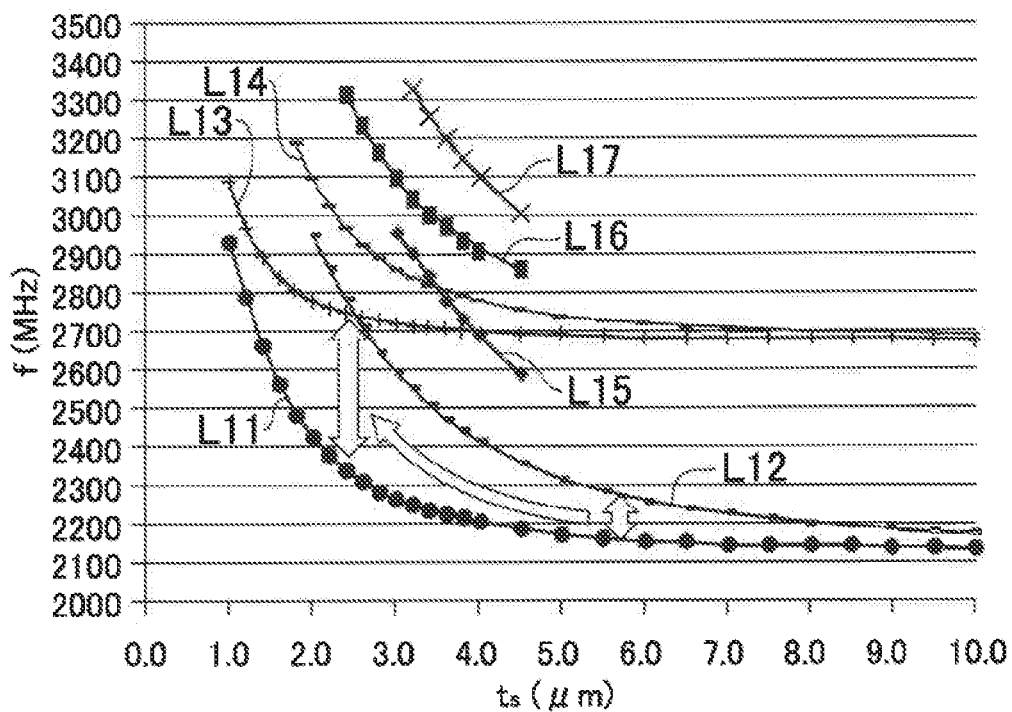
FIG. 4A is a graph showing an influence of a thickness of a piezoelectric substrate exerted upon a frequency of spurious.

FIG. 4A is a graph showing the results of simulation calculations described above.

In this graph, the abscissa ($t_s$) shows the thicknesses of the piezoelectric substrates 7. The ordinate (f) indicates the frequencies of the bulk waves. The plurality of lines L11 to L17 indicate the frequencies of two or more types of bulk waves between which at least one of the modes of vibration direction and modes of order are different from each other.

Note that, in this graph, plots of the lines L15, L16, and L17 were shown up to the middle. In actuality, however, the lines showing a fall of frequencies along with an increase of thicknesses continue in the same way as the lines L11 to L14. Further, although not shown, even after the line L17 (line L18, line L19, . . . ), there are numerous lines having the same tendency as that of L11 to L17.

In a usual bonded substrate, 20 μm is recommended in many cases as the thickness of the piezoelectric substrate 7. Therefore, in the usual bonded substrate, the frequency band used (not shown in FIG. 4A. For example represented by a line segment parallel to the ordinate (f)) cuts across numerous intricate lines (L11 to L17 etc.) on the side further thicker than the thickness range shown in FIG. 4A. As a result, a bulk wave spurious is generated all over the frequency band which is used.

As shown in this graph, in the bulk wave of any mode, the thinner the thickness of the piezoelectric substrate 7, the higher the frequency.

The line L11 and the line L12 indicate the frequencies of the bulk waves between which the modes of vibration direction are the same as each other and the modes of order are different from each other. As indicated by the arrows, the thinner the thickness of piezoelectric substrate 7, the larger the frequency interval of these two bulk waves. Note that, this is true also for the other bulk waves between which the modes of vibration direction are the same as each other, and the modes of order are different from each other (for example, the lines L13 and L14).

Figure 4B:
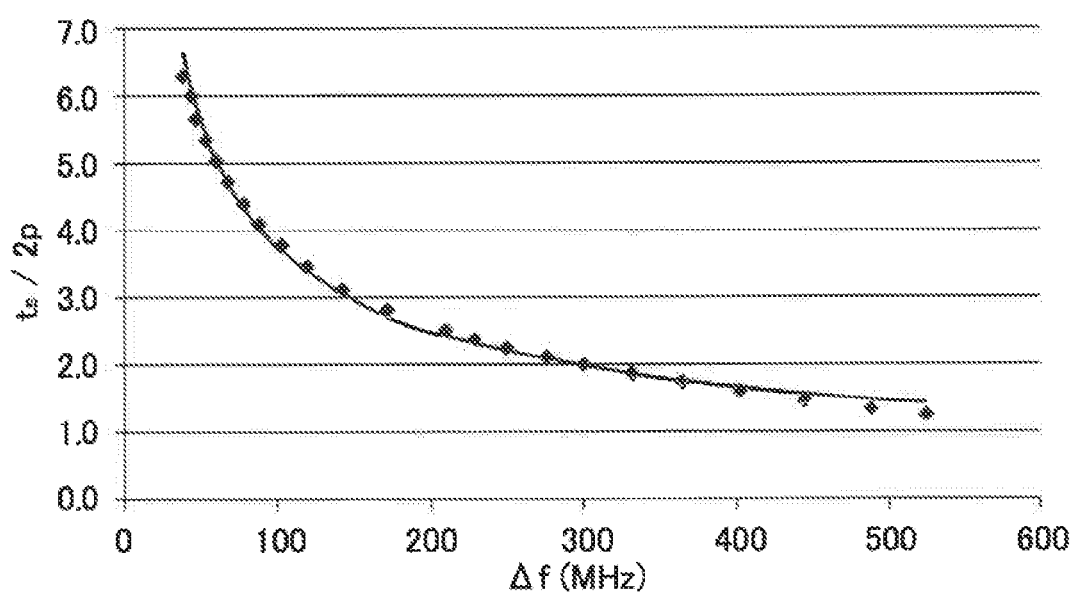
FIG. 4B is a graph showing an influence of a thickness of a piezoelectric substrate exerted upon a frequency interval of spurious.

FIG. 4B is a graph showing the relationships between the thickness of the piezoelectric substrate 7 and the frequency interval of the bulk waves of the same mode of vibration direction, but which are different in the mode of order as described above. This graph is obtained from the results of simulation calculations.

The abscissa Δf indicates the frequency interval. The ordinate $t_s/2p$ indicates the normalized thickness of the piezoelectric substrate 7. The normalized thickness $t_s/2p$ is obtained by dividing the thickness $t_s$ of the piezoelectric substrate 7 by two times of the pitch "p" of the electrode fingers 19 (basically the same as the wavelength λ) and is a dimensionless quantity (there is no unit). In this graph, each plot indicates the frequency interval of the bulk waves obtained by the simulation calculations, and the lines indicate approximation curves.

As shown in this graph, the frequency interval of the bulk waves where the normalized thickness of the piezoelectric substrate 7 is made thin increases more sharply the thinner the normalized thickness of the piezoelectric substrate 7. For example, when the normalized thickness $t_s/2p$ is 5 or more, the frequency interval does not change so much. On the other hand, when the normalized thickness $t_s/2p$ becomes 3 or less, the frequency interval suddenly increases. Note that, the slant of the curve approaches a constant level if the normalized thickness $t_s/2p$ becomes 3 or less.

(Principle of Suppression of Bulk Wave Spurious)

Figure 5:
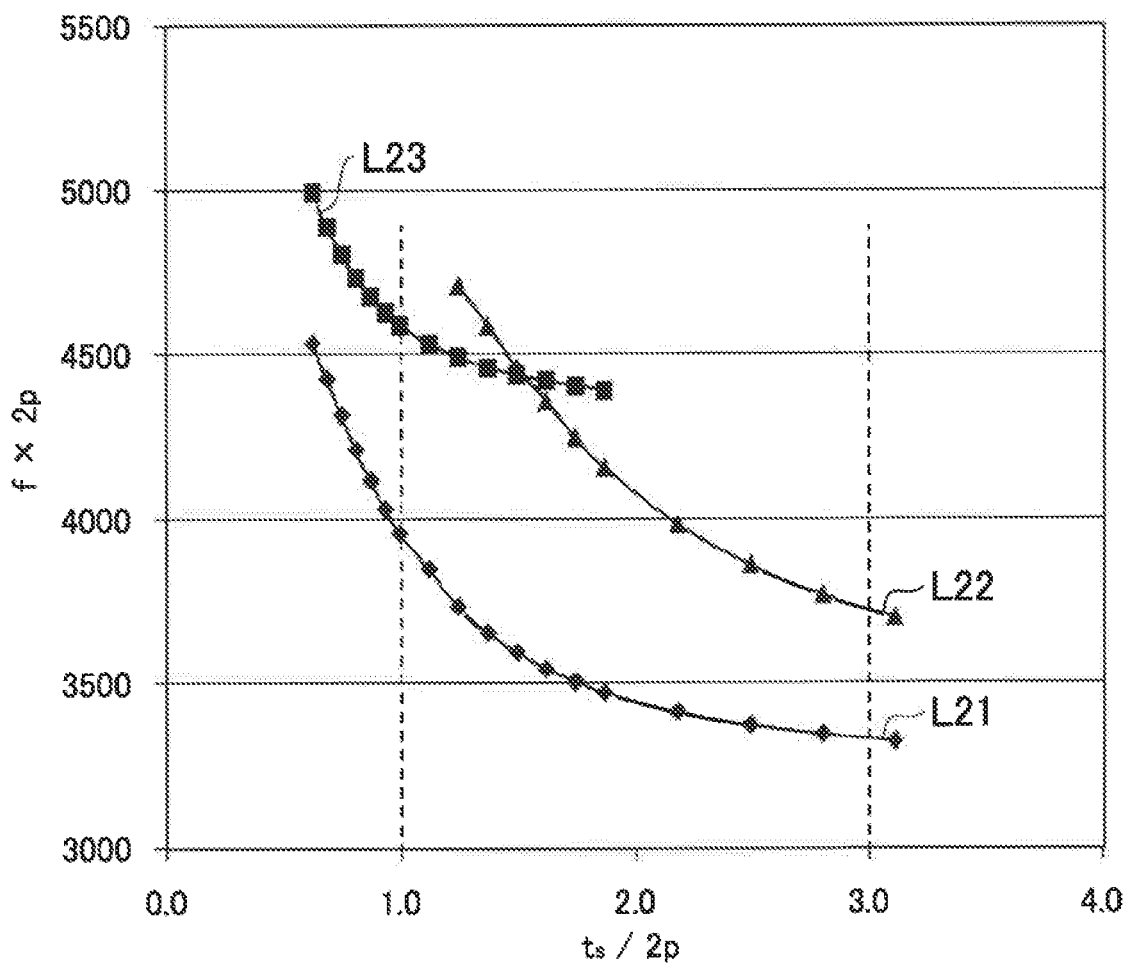
FIG. 5 A graph for explaining a method of setting a thickness of a piezoelectric substrate in the SAW element in FIG. 1.

FIG. 5 is a graph like FIG. 4A, that is, it shows the relationships between the thickness of the piezoelectric substrate and the frequency of the bulk wave. Further, it indicates frequencies of three bulk waves on the side where the frequency is low within a range where the thickness of the piezoelectric substrate 7 is relatively thin.

FIG. 5 is obtained based on simulation calculations. The simulation conditions will be shown below:
Piezoelectric substrate:
  Material: Lithium tantalate single crystal
  Cut angle: 42° Y-plate
Support substrate: Silicon
IDT electrode:
  Material: Al—Cu alloy
  Thickness $t_e$: 121 nm
  Pitch "p" of electrode fingers: 0.80414 μm
  Duty ratio w/p of electrode fingers: 0.5

In FIG. 5, the abscissa indicates the normalized thickness $t_s/2p$, and the ordinate indicates the normalized frequency f×2p. The normalized frequency f×2p is the product of the frequency "f" and two times of the pitch "p" of the electrode fingers 19 (basically the same as the wavelength λ).

The line L21 indicates the bulk wave having the lowest frequency in a shown range (the range where $t_s/2p$ is 1 to 3 and the periphery of that). This bulk wave will be called the "bulk wave of the first type in the order mode of the first vibration direction mode". Note that, the vibration direction of the first vibration direction mode is substantially the D3-axis direction in the lithium tantalate. Note that, this line L21 is generated on the lowest frequency side among the bulk waves which may be generated.

The line L22 indicates the bulk wave having the next lowest order (frequency from another viewpoint) relative to the bulk wave of the line L21 among the bulk waves having the same vibration direction mode as that of the bulk wave of the line L21. This bulk wave will be called "the bulk wave of the second type in the order mode of the first vibration direction mode".

The line L23 is the bulk wave having the lowest frequency in the shown range among the bulk waves which are different in the vibration direction mode from that of the bulk waves of the lines L21 and L22. This will be called "the bulk wave of the second type in the order mode of the second vibration direction mode". The line L23 is higher in frequency than the line L21, but crosses the line L22 and is lower in frequency than the line L22 in a range where the normalized thickness $t_s/2p$ is thinner than the intersection. Note that, the vibration direction of the first vibration direction mode is substantially the D2 direction in the lithium tantalate.

The lines L21 to L23 correspond to the lines L11 to L13 in FIG. 4A. As understood from the explanation for the lines L21 to L23 explained above and comparison between FIG. 5 and FIG. 4A, in the shown range, there is no bulk wave drawing a line positioned under the line L21 (the frequency is lower). Further, in the shown range, there is no a bulk wave drawing a line positioned between the line L21 and the line L22 or L23 either. In other words, the other bulk waves, in the shown range, are positioned above the lines L22 and L23 (frequencies are higher).

Accordingly, in the SAW element, when the predetermined frequency band (standardized) where spurious caused by the bulk wave is undesirable is kept in the region surrounded by the lines L21 to L23, no bulk wave spurious is generated in the predetermined frequency band. That is, the thickness $t_s$ (standardized thickness $t_s/2p$) of the piezoelectric substrate 7 may be set so that the predetermined frequency band is kept in the range of the line L21 to the line L23 in this way. The resonator 5 and IDT electrode 11 satisfying such relationships will be referred to as the first resonator and first IDT electrode.

The frequency band where spurious is undesirable is for example the frequency band between the resonance frequency and the anti-resonance frequency (including the resonance frequency and anti-resonance frequency) in the SAW resonator. Further, in the SAW filter, it is for example the passband.

In products which are actually being marketed, when judging whether the relationships as explained above are satisfied (whether the present embodiment is utilized), the resonance frequency, anti-resonance frequency, or passband may be obtained by for example actual measurement or may be identified based on a specification sheet etc. The bulk wave spurious is for example obtained by the measurement.

In FIG. 5, the reason why attention is paid to the thin piezoelectric substrate 7 side is that for example as explained with reference to FIG. 4A and FIG. 4B, the thinner the piezoelectric substrate 7, the broader the frequency interval of bulk waves. That is, the thinner the piezoelectric substrate 7, the easier it becomes to keep the frequency band where spurious is undesirable between the frequencies of bulk waves.

Further, in addition to the side where the piezoelectric substrate 7 is thin, attention is paid to the side where the frequency of the bulk wave is low (that is, lines L21 to L23). This is because, for example, when considering the actually used frequency of the SAN, it is easy to keep the frequency band where a bulk wave spurious is undesirable between the frequencies of bulk waves. Further, for example, there is also no longer a need for considering crossing of lines indicating bulk waves of various modes (see lines L11 to L17 in FIG. 4A).

Note that, from the viewpoint of design, the frequency band where a bulk wave spurious is undesirable will be positioned in a region surrounded by the lines L21 to L23 indicating the frequencies of bulk waves of three modes on the side where the normalized thickness $t_s/2p$ is low and the side where the frequency is low when the normalized thickness $t_s/2p$ of the piezoelectric substrate 7 is plotted on the abscissa and the frequency of the bulk wave is plotted on the ordinate as described above.

However, when viewing the SAW element as a single finished product, this product has only one value as the normalized thickness $t_s/2p$. Therefore, the frequency band where a bulk wave spurious is undesirable will be kept between the frequency of the bulk wave spurious having the lowest frequency and the frequency of the bulk wave spurious having the next lowest frequency. Further, the next lowest frequency described above is the frequency of the line L22 or the frequency of the line L23 (both at the intersection).

Note that, the region surrounded by the lines L21 to L23 is the region in which no bulk wave is generated as explained above. Further, this region is a special region which becomes extremely broad even compared with the other regions which are surrounded by a variety of lines in any combination. This has the following two advantages. The first advantage is the advantage in the ordinate direction in the graph that no bulk wave spurious at all is generated in a certain frequency range (for example between the resonance frequency and the anti-resonance frequency, the pass-band when configuring a filter, and so on). The second advantage is the advantage in the abscissa direction in the graph that no bulk wave spurious is generated even if the thickness of the piezoelectric substrate 7 varies a little.

(Specific Range of Thickness of Piezoelectric Substrate)

From the viewpoint of utilizing the principle of reducing the bulk wave spurious described above, the standardized thickness $t_s/2p$ is for example 1 to 3.

If $t_s/2p$ is less than 1, for example, the loss of the SAW becomes large. Further, for example, the frequency of the SAW becomes susceptible to the influence of the state of the bottom surface of the piezoelectric substrate 7, and the variation of frequency characteristics becomes large among the plurality of SAW elements 1. Further, for example, it becomes difficult to secure the strength of the piezoelectric substrate 7. Conversely speaking, if $t_s/2p$ is 1 or more, such an inconvenience is solved or reduced.

Further, if $t_s/2p$ is 3 or less, as already alluded to, when considering the fact that the frequency interval of the bulk waves different in mode from each other is relatively wide and the actual propagation speed of the SAW, it is easy to keep the frequency band where spurious is undesirable in the range of the lines L21 to L23.

Note that, a standardized thickness $t_s/2p$ of 1 to 3 is just one example of the range of the standardized thickness $t_s/2p$. The frequency band where spurious is undesirable may be kept between the line L21 and the line L22 or L23 within a range where the standardized thickness $t_s/2p$ is less than 1 or exceeds 3 as well.

2p (basically same as λ) is for example 1.5 μm go 6 μm as already explained. Accordingly, $t_s$ is for example 1.5 μm to 18 μm. Aiming at other effects accompanied with slimming of the piezoelectric substrate 7 (for example increase of temperature compensation effect of the support substrate 9) and so on, $t_s$ may be made further thinner than that in the range described above and set to 1.5 μm to less than 10 μm as well.

(Adjustment of Electrode Thickness)

A thickness $t_e$ of the IDT electrode 11 of about 7% of the wavelength λ(2p) is usually regarded as good from the perspective of the excitation efficiency of the SAN. Further, it is known that the thickness $t_e$ of the IDT electrode 11 exerts an influence upon the resonance frequency. Specifically, the thinner the thickness $t_e$ of IDT electrode 11, the higher the resonance frequency.

On the other hand, according to the simulation calculations by the inventors of the present application, when the thickness $t_e$ of the IDT electrode 11 is changed, the frequency of the bulk wave does not change so much compared with the frequency of the SAW. Further, when the pitch "p" of the electrode fingers 19 is made narrower, naturally the frequency of the SAW becomes higher. Further, also the frequency of the bulk wave becomes higher. At this time, the bulk wave has a higher frequency the higher order the mode.

Accordingly, if the thickness $t_e$ of the IDT electrode 11 is made thicker and the pitch of the electrode fingers 19 is made narrower so as to compensate for a drop of frequency of the SAW due to the increase of the thickness, the frequency interval of the bulk waves can be made wider with respect to the frequency band where spurious of a bulk wave is undesirable.

FIG. 6 is a graph corresponding to FIG. 5 in a case where the thickness $t_e$ of the IDT electrode 11 is made thicker than that in FIG. 5. More specifically, the states when the modes of bulk waves corresponding to the line L22 and line L23 increased in thickness are indicated by the lines L32 and L33.

FIG. 6 is obtained based on the simulation calculations in the same way as FIG. 5. The simulation conditions different from those in FIG. 5 will be shown below.

IDT electrode:

Thickness $t_e$: 201 nm

Pitch "p" of electrode fingers: 0.75768 μm

The lines L31 to L33 correspond to the lines L21 to L23. That is, the lines L31 to L33 correspond to the first type in the order mode of the first vibration direction mode, the second type in the order mode of the first vibration direction mode, and the first type in the order mode of the second vibration direction mode. Note that, the abscissa in the graph is made the same as that in FIG. 5. That is, this indicates values before adjustment of the thickness and pitch of the IDT electrode 11.

As shown in this graph, in FIG. 6, compared with FIG. 5, the frequencies of the line L32 and the line L33 (particularly the line L32) become higher and consequently the range of frequencies in the region surrounded by the lines L31 to L33 becomes broad. Due to this, it is made easier to locate the frequency band where a bulk wave spurious is undesirable in this region.

Specifically, in the characteristics shown in FIG. 5, in for example a case where the bulk wave spurious must be suppressed in the range where the standardized frequency plotted on the ordinate corresponds to 4200 to 4600, the bulk wave spurious cannot be completely suppressed. Further, when the bulk wave spurious must be suppressed in the frequency range where the standardized frequency corresponds to 4000 to 4500, suppression becomes very hard or the thickness of the piezoelectric substrate 7 must be set in a certain very limited thickness range. Contrary to this, in the case of the characteristics shown in FIG. 6, the bulk wave spurious can be suppressed even in a frequency range where the standardized frequency corresponds to 4200 to 4600. In the same way, the substrate thickness range of the piezoelectric substrate 7 capable of suppressing the bulk wave spurious in the frequency range where the standardized frequency corresponds to 4000 to 4500 can be secured with an extras margin.

In this way, the results in FIG. 6 show that the special range explained before which is surrounded by the lines L21 to L23 in FIG. 5 can be displaced to the desired position by adjusting the thickness and pitch of the IDT electrode 11. That is, the specific region can be displaced to a high frequency side or displaced to a low frequency side. Further, it is able to adjust it so that the thickness range of the piezoelectric substrate 7 capable of suppressing bulk wave spurious becomes the feasible region or widen the thickness range.

The inventors of the present application, in order to quantitatively evaluate the difference of thickness $t_e$ of the electrodes, performed simulation calculations while making the thickness $t_e$ different in various ways. Conditions of the simulation calculations will be shown below.

Piezoelectric substrate:
  Material: Lithium tantalate single crystal
  Cut angle: 42° Y-plate
  Thickness $t_s$: 2.4 μm (normalized thickness $t_s/2p$: about 1.5)
Support substrate: Silicon
IDT electrode:
  Material: Al—Cu alloy
  Thickness $t_e$: Made different for every 10 nm in a range of 121 nm to 221 nm
  Pitch "p" of electrode fingers: 0.8025 μm
  Duty ratio w/p of electrode fingers: 0.5

Note that, when considering the electromechanical coupling coefficient and thinking based on the excitation characteristic of the SAW as explained before, the thickness $t_e$ of the electrode may be set to 112 nm ($t_e/2p$ is about 0.07). On the other hand, when considering the influence of bulk wave spurious, the strength of the bulk wave itself may be made smaller as well. For this reason, the thickness $t_e$ of the electrode where the excitation characteristic of the bulk wave becomes the lowest at the time of the resonance frequency, that is, 121 nm ($t_e/2p$ is about 0.075), is set as the basis.

Using a case where the thickness $t_e$ of the electrode is 121 nm ($t_e/2p$ is about 0.075) as a reference, the amount of increase of the frequency difference between the anti-resonance frequency and the bulk wave spurious when increasing the thickness $t_e$ of the electrode was evaluated. The bulk waves having frequency differences from the anti-resonance frequency which are found are two bulk waves of the second type in the order mode of the first vibration direction mode and the first type in the order mode of the second vibration direction mode. The frequencies of the two are higher than the anti-resonance frequency. The increase of frequency difference here at the time when the pitch "p" is made constant and only the thickness $t_e$ is changed is mainly caused by a shift of the anti-resonance frequency to a low frequency side. Hereinafter, sometimes the increased amount of the frequency difference will be referred to as the "shift amount".

The results of calculation will be shown below. Note that, the normalized shift amount is obtained by dividing the shift amount by the resonance frequency found from 2p. The resonance frequency found from 2p is different from the resonance frequency by simulation which is influenced by the thickness $t_e$ etc. Here, the fine difference was rounded off to obtain 2500 MHz. The shift amount here is mainly due to the shift of the anti-resonance frequency to a low frequency side as explained above. However, frequencies of the two bulk wave spuriouses are displaced a little according to the change of the thickness $t_e$, therefore there is a range in the shift amount of the amount of increase of the frequency difference (two types of frequency difference) of the anti-resonance frequency with respect to the frequencies of the two bulk wave spuriouses.

| $t_e$ (nm) | $t_e/2p$ | Shift amount (MHz) | Normalized shift amount |
|---|---|---|---|
| 121 | 0.075 | 0 | 0 |
| 131 | 0.082 | 7.8 | 0.003 |
| 141 | 0.088 | 21.0 | 0.008 |
| 151 | 0.094 | 30~33 | 0.012~0.013 |
| 161 | 0.100 | 44~50 | 0.018~0.020 |
| 171 | 0.107 | 60~66 | 0.024~0.026 |
| 181 | 0.113 | 77~86 | 0.031~0.034 |
| 191 | 0.119 | 99~109 | 0.040~0.044 |
| 201 | 0.125 | 119~133 | 0.048~0.053 |
| 211 | 0.131 | 141~158 | 0.056~0.063 |
| 221 | 0.138 | 165~184 | 0.066~0.074 |

The general value of the normalized thickness $t_e/2p$ of the electrode is 0.07 as explained above. Therefore, if the normalized thickness $t_e/2p$ of the electrode is 0.075, this may be said to be a film thickness characteristic considering the bulk wave. Further, if the normalized thickness $t_e/2p$ of the electrode is 0.080 or more, the thickness becomes thicker by about 15% than the general value 0.07 of the normalized thickness $t_e/2p$ of the electrode, therefore this may be said to aim at the effect of raising the frequencies of the lines L32 and L33 as explained above.

Further, for example, in each band of the UMTS (Universal Mobile Telecommunications System), if the value obtained by dividing the width of the passing frequency band by the frequency at the center in this band is defined as the "normalized band width", the minimum normalized band width is 0.011 of the transmission pass-band of the band 6 ((885 MHz–875 MHz)/880 MHz). Accordingly, at the time when the normalized thickness $t_e/2p$ of the electrode is 0.094, it may considerably exceed the range permissible as the error range in the UMTS. Accordingly, for example, if the normalized thickness $t_e/2p$ of the electrode is 0.095 or more, it may be aimed at the effect of raising the frequencies of the line L32 and line L33 as explained above.

In the simulation calculations described above, if the thickness $t_e$ of the electrode exceeds 201 nm, the resonance frequency falls down to the frequency of the bulk wave spurious of the first type of the first vibration direction mode and spurious arises between the resonance frequency and the anti-resonance frequency. Accordingly, from this result, the normalized thickness $t_e/2p$ of the electrode may be set to 0.12 or less. The resonator 5 and IDT electrode 11 having such electrode thicknesses aimed at the effect of raising the frequencies of the line L32 and line L33 are referred to as the "first resonator" and "first IDT electrode".

Comparison of Spurious in Comparative Example and Working Example

SAW resonators according to a comparative example and working example were prepared, and the resonator characteristics thereof were checked and compared. Between the comparative example and working example, only the thickness of the piezoelectric substrate 7 (lithium tantalate single crystal) is different. The standardized thickness $t_s/2p$ of the piezoelectric substrate in the comparative example is 4.5, and the standardized thickness $t_s/2p$ of the piezoelectric substrate in the working example is 1.1.

FIG. 7A and FIG. 7B and FIG. 8A and FIG. 8B are graphs showing the measurement values of the characteristics of the SAW resonators according to the comparative example and working example.

Figure 7A:
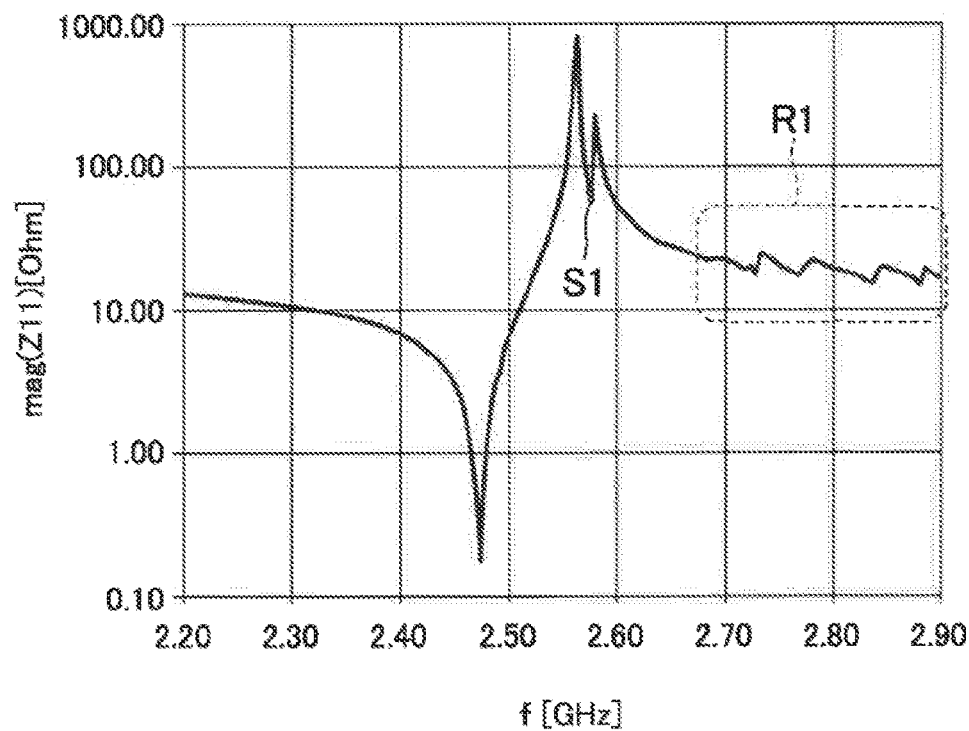
FIG. 7A and FIG. 7B are graphs showing impedance characteristics in a comparative example and a working example.
Figure 7B:
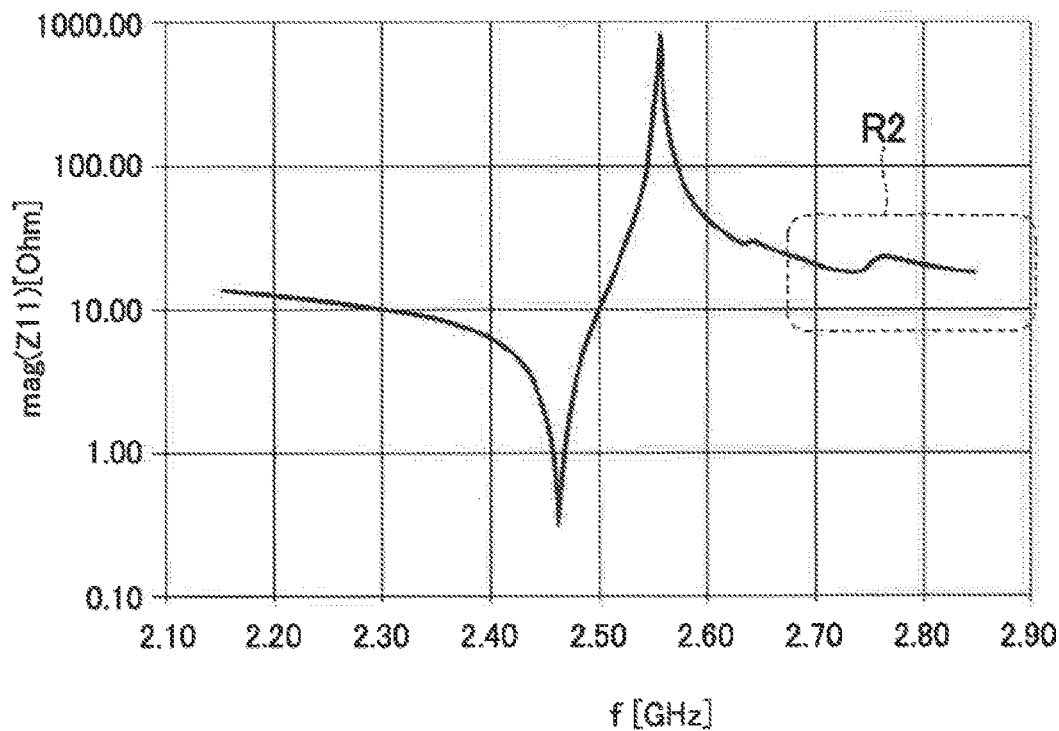
Figure 8A:
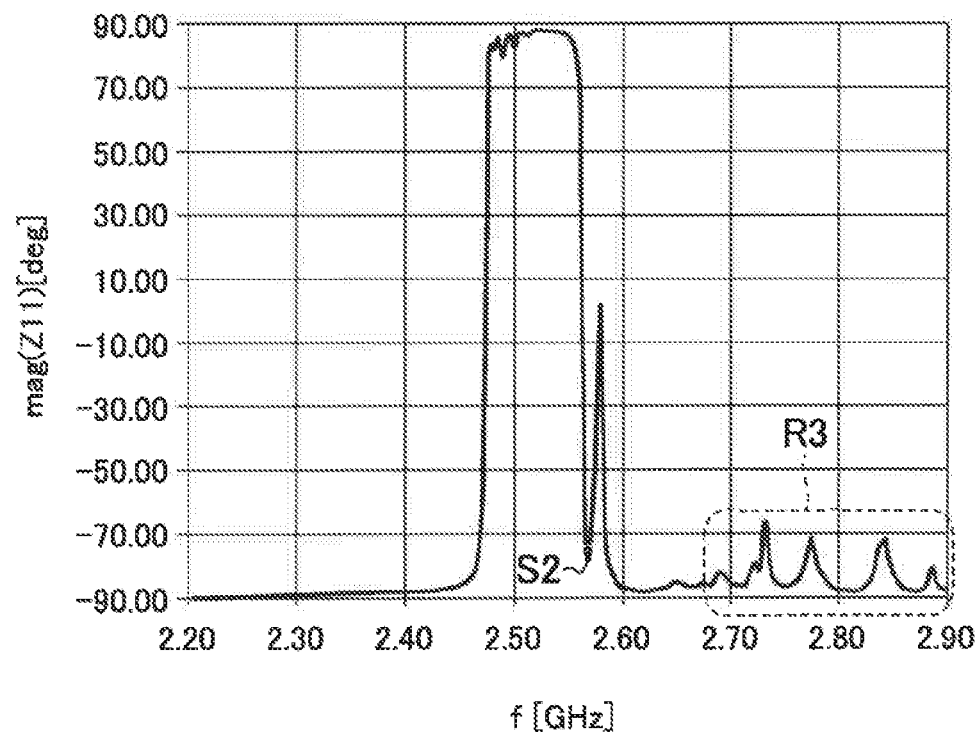
FIG. 8A and FIG. 8B are graphs showing phase characteristics in a comparative example and a working example.
Figure 8B:
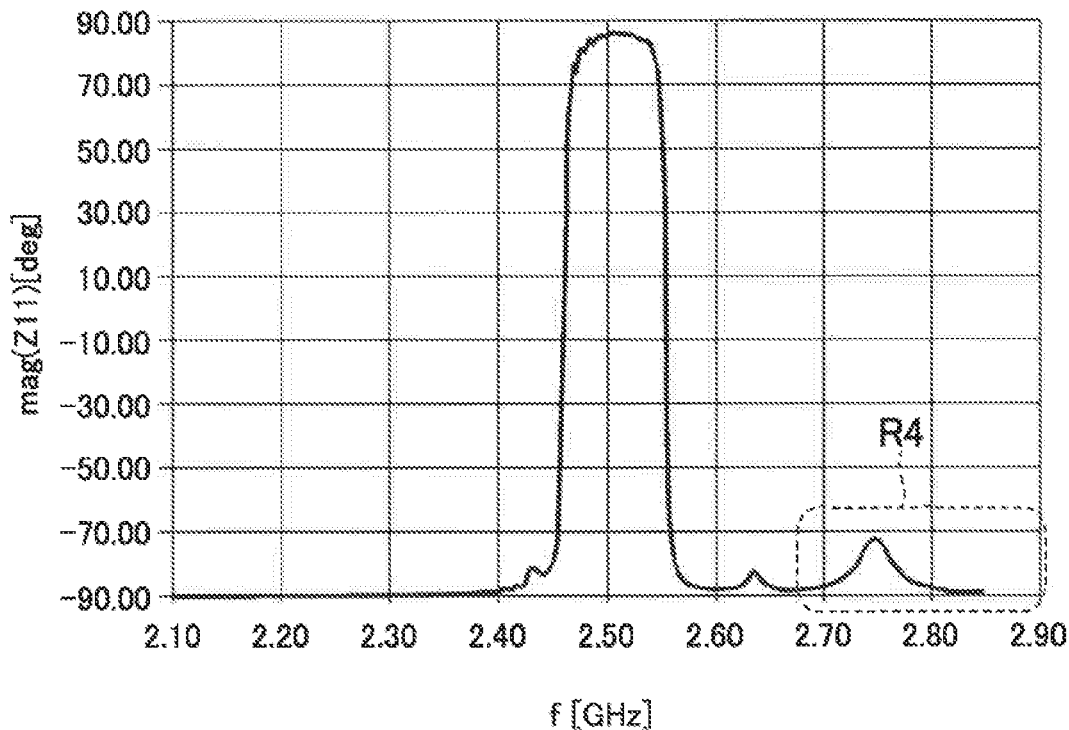

In these graphs, the abscissas "f" indicate the frequencies. In FIG. 7A and FIG. 7B, the ordinates (mag) indicate the absolute values (Ω) of impedance. In FIG. 8A and FIG. 8B, the ordinates (ang) indicate the phases (°) of impedance. FIG. 7A and FIG. 8A show the comparative example, and FIG. 7B and FIG. 8B show the working example.

In FIG. 7A, a spurious S1 is generated in the vicinity of the anti-resonance frequency. However, in FIG. 7B, the spurious S1 is not generated in the vicinity of the anti-resonance frequency. In the same way, in FIG. 8A, a spurious S2 is generated in the vicinity of the anti-resonance frequency. However, in FIG. 8B, the spurious S2 is not generated in the vicinity of the anti-resonance frequency.

Further, the spuriouses generated in a region R1 in FIG. 7A are not generated in a region R2 in FIG. 7B corresponding to the region R1. In the same way, the spuriouses generated in a region R3 in FIG. 8A are not generated in a region R4 in FIG. 8B corresponding to the region R3.

In this way, even in the measurement values, it was confirmed that the principle of reduction of bulk wave spurious explained above stands.

As described above, the SAW element 1 according to the present embodiment has the piezoelectric substrate 7, the support substrate 9 which is bonded to the bottom surface of the piezoelectric substrate 7, and the IDT electrode 11 positioned on the top surface of the piezoelectric substrate 7. Further, the resonance frequency and anti-resonance frequency of the resonator 5 including the IDT electrode 11 are kept between the frequency of the bulk wave spurious having the lowest frequency (see for example the line L21) and the frequency of the bulk wave spurious having the next lowest frequency (see for example the line L22 or L23).

Further, from another viewpoint, the SAW element 1 according to the present embodiment has the piezoelectric substrate 7, the support substrate 9 bonded to the bottom surface of the piezoelectric substrate 7, and the IDT electrode 11 positioned on the top surface of the piezoelectric substrate 7. Further, when the pitch of the electrode fingers 19 in the IDT electrode 11 is defined as "p", and the thickness of the piezoelectric substrate 7 is defined as $t_s$, the normalized thickness $t_s/2p$ of the piezoelectric substrate 7 is 1 to 3.

Accordingly, as already explained, the spurious in the frequency band where spurious is undesirable can be reduced by raising the frequency of the bulk wave spurious while broadening the frequency interval of the bulk wave spuriouses. Further, for example, since the frequency interval of spuriouses is wide, even if there is an error in the thickness of the piezoelectric substrate 7 and the frequency of spurious changes, the liability of the spurious being positioned in the frequency band where spurious is undesirable is reduced. That is, the allowable tolerance of the thickness of the piezoelectric substrate 7 with respect to the generation of spurious becomes large. Further, for example, loss by irradiation of the bulk wave is suppressed and energy of vibration is closed inside the bonded substrate 3, therefore insertion loss of the SAW element can be improved. Further,
the support substrate 9 becomes relatively thick, therefore the temperature characteristic is improved.

Further, in the present embodiment, the bulk wave spurious having the lowest frequency (see for example the line L21) and the bulk wave spurious having the next lowest frequency (see for example the line L22) may be the same in the mode relating to the direction of vibration as each other, but may be different in the mode relating to the order from each other. In other words, the normalized thickness $t_s/2p$ may be the thickness where such a relationship of frequencies stands.

In this case, for example, compared with the case where the frequency band where spurious is undesirable is positioned between the line L21 and the line L23, the thickness of the piezoelectric substrate 7 is made thicker, therefore the demerit when forming the piezoelectric substrate 7 as a thin type can be suppressed. For example, the strength of the piezoelectric substrate 7 can be made relatively strong. Further, for example, the change of the frequency interval of two bulk wave spuriouses (see the lines L21 and L22) is easily predicted, so design is easier. Further, the increase of frequency interval when making the normalized thickness of the IDT electrode 11 larger (see the lines L31 and L32) is larger. Design is facilitated also on this point.

Further, in the present embodiment, the bulk wave spurious having the lowest frequency (see for example the line L21) and the bulk wave spurious having the next lowest frequency (see for example the line L23) may be different in the mode relating to the direction of vibration from each other as well. In other words, the normalized thickness $t_s/2p$ may be the thickness where such a relationship of frequencies stand.

In this case, for example, compared with the case where the frequency band where spurious is undesirable is positioned between the line L21 and the line L22, the thickness of the piezoelectric substrate 7 is made thinner, therefore the merit when the thickness of the piezoelectric substrate 7 is made thinner such as improvement of the temperature characteristic becomes larger. Further, for example, the vibration directions of the two spuriouses which are nearest the frequency band where spurious is undesirable are different, therefore the chance that these vibrations will be coupled to exert influence upon the frequency band where spurious is undesirable is reduced.

Note that, in accordance with the demanded specifications etc., the embodiment of utilizing the region between the line L21 and the line L22 and the embodiment of utilizing the region between the line L21 and the line L23 may be suitably selected.

Further, in the present embodiment, when the pitch of the electrode fingers 19 in the IDT electrode 11 is "p" and the thickness of the electrode finger 19 is $t_e$, the normalized thickness $t_e/2p$ of the electrode finger 19 is 0.095 or more.

In this case, the frequency interval of bulk wave spuriouses is wide, therefore the chance of appearance of a spurious in the frequency band where spurious is undesirable is reduced. Further, due to the frequency interval becoming wide, the permissible tolerance of the thickness of the piezoelectric substrate 7 relating to generation of spurious becomes larger.

Figure 9A:
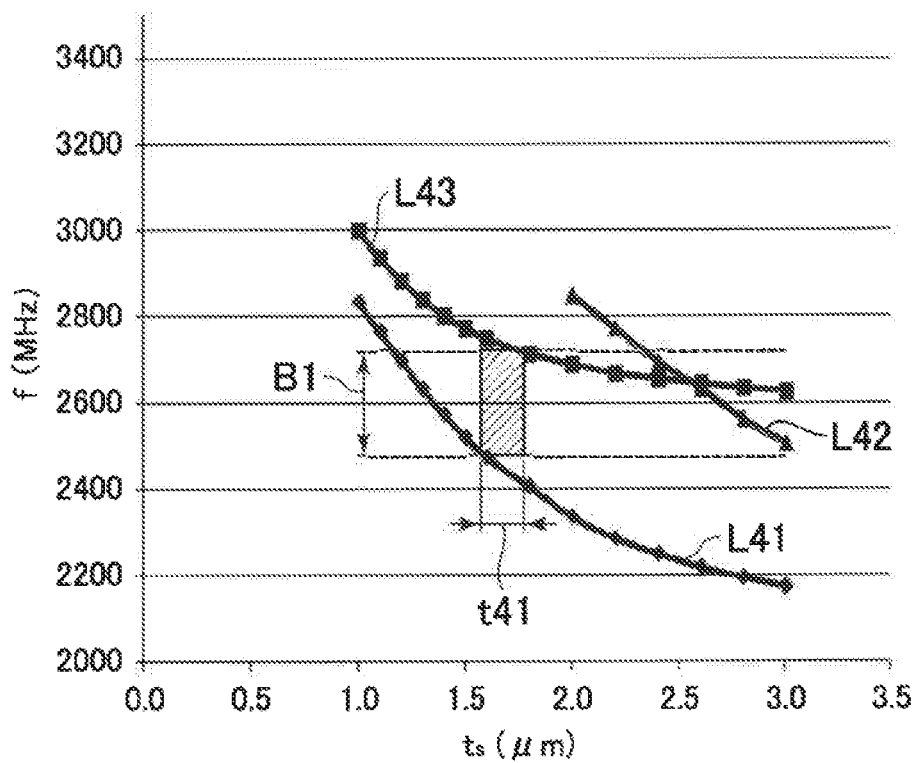
FIG. 9A and FIG. 9B are graphs for explaining an influence of change of electrode thickness.
Figure 9B:
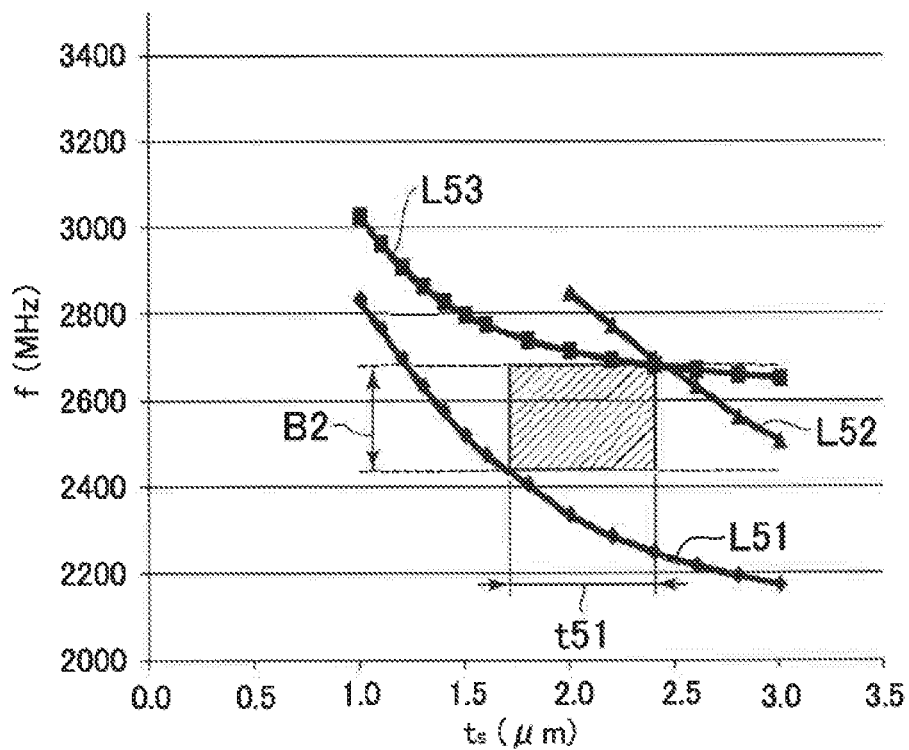

FIG. 9A and FIG. 9B are graphs for explaining the effect of the permissible tolerance becoming larger as described above.

In FIG. 9A and FIG. 9B, the abscissas indicate the thicknesses $t_s$ of the piezoelectric substrates 7, and the ordinates indicate the frequencies "f" of bulk waves. Note that, they are not normalized in the graphs.

Further, lines L41 to L43 (FIG. 9A) and lines L51 to L53 (FIG. 9B) indicate frequencies of bulk waves in various modes. Specifically, the lines L41 and L51 correspond to the first type in the order mode of the first vibration direction mode, the lines L42 and L52 correspond to the second type of the order mode of the first vibration direction mode, and the lines L43 and L53 correspond to the first type of the order mode of the second vibration direction mode.

Further, the frequency band B1 (FIG. 9A) and frequency band B2 (FIG. 9B) indicate the frequency bands where spurious is undesirable.

In FIG. 9B, the thickness $t_e$ of the IDT electrode 11 is made larger compared with FIG. 9A. Due to this, the frequency becomes lower in the frequency band B2 than that in the frequency band B1. Note that, as already explained, normally, the pitch "p" of the electrode fingers 19 is made narrower in the case of FIG. 9B so that the frequency band B2 coincides with the frequency band B1. Note, FIG. 9B indicates the results of computation in a state where such adjustment is not carried out.

In FIG. 9A, in the frequency band B1, a region fitting inside a region surrounded by the lines L41 to L43 is shown with hatching. A range t41 of the thickness $t_s$ corresponding to this region is the range which can be set as the thickness of the piezoelectric substrate 7. In the same way, in FIG. 9B, in the frequency band B2, a region fitting inside a region surrounded by the lines L51 to L53 is shown with hatching, and a range t51 of the thickness $t_s$ corresponding to this region is the range which can be set as the thickness of piezoelectric substrate 7.

Further, in FIG. 9B, by making the thickness $t_e$ of the IDT electrode 11 thicker compared with FIG. 9A, the frequency band B2 moves to a position at which the area of the region surrounded by the lines L51 to L53 becomes wider, therefore the range t51 becomes broader than the range t41. By the amount of increase of width, the permissible tolerance of the thickness $t_s$ of the piezoelectric substrate 7 becomes larger.

(Support Substrate)

In the example explained above, the case of using an Si substrate as the support substrate was explained as an example. However, it is confirmed that the case of using a sapphire substrate is the same. Specifically, when representing the lines L21 to L23 shown in FIG. 5 by equations, although the coefficients determining slant etc. are different, the same tendency is confirmed. Specifically, where the standardized thickness is "x" and the standardized frequency is "y", approximate equations of the lines L21 to L23 become as follows in the case where use is made of a Si substrate as the support substrate.

$$y=71.865x^4-706.82x^3+2641.5x^2-4567.1x+6518.1 \qquad L21:$$

$$y=466.89x^4-2884x^3+6768x^2-7310.5x+7544.4 \qquad L22:$$

$$y=-66.245x^3+689.86x^2-2546x+6941.6 \qquad L23:$$

In the same way, when use is made of a sapphire substrate, the approximate equations of the lines L21 to L23 become as follows.

$$y=33.795x^4-419.77x^3+1966.9x^2-4212.8x+6990.5 \qquad L21:$$

$$y=54.624x^3+625.48x^2-2533.6x+7334.6 \qquad L22:$$

$$y=-258.23x^3+1477.7x^2-2912.2x+6418.1 \qquad L23:$$

Note that, "2p" for normalization is not an actual pitch, but one indicating the wavelength λ of the SAW which is excited.

(SAW Filter)

In the above explanation, the resonator 5 shown in FIG. 1 and FIG. 2 was mainly explained as an example. However, the above method of suppressing spurious keeping the frequency band where spurious is undesirable in the region surrounded by curves of three bulk waves (for example lines L21 to L23) on the side where the thickness of the piezoelectric substrate is low and the side where the frequency is low may be applied to the SAW filter as well. Examples of the SAW filter will be shown below.

Figure 10A:
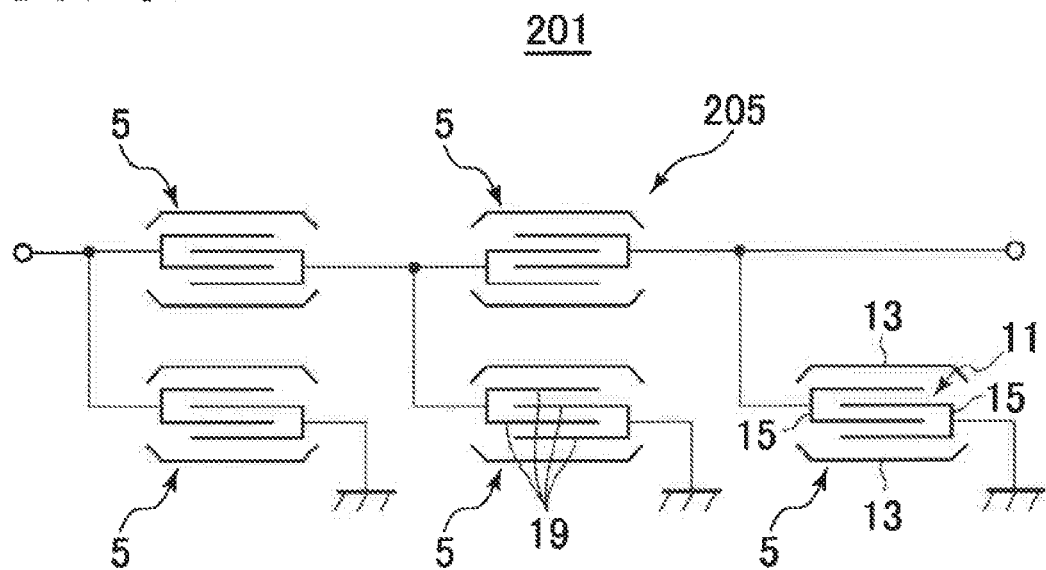
FIG. 10A and FIG. 10B are schematic views showing an example of a SAW filter according to an embodiment of the present disclosure.

FIG. 10A schematically shows a SAW element 201 having a ladder type SAW filter 205. The filter 205, in the same way as the resonator 5 shown in FIG. 1 and FIG. 2, is configured by providing an IDT electrode 11 etc. on the bonded substrate 3. Specifically, the filter 205 has a plurality of resonators 5 which are serially connected to each other (resonators 5 shown in the upper stage in FIG. 10A, below, sometimes referred to as the "serial resonators") and a plurality of resonators which connect this serial connection system and the reference potential portion (connected parallel) (below, sometimes referred to as parallel resonators).

Figure 10B:
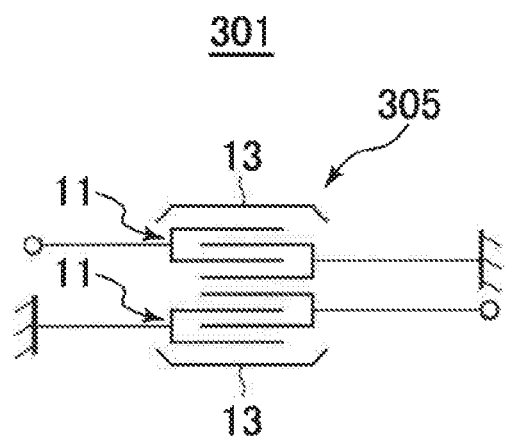

FIG. 10B schematically shows a SAW element 301 having a SAW filter 305 of a multiplex mode type (including the double mode type in the present embodiment). Also, the filter 305 is configured by providing the IDT electrode 11 etc. on the bonded substrate 3 in the same way as the resonator 5 shown in FIG. 1 and FIG. 2. Specifically, the filter 305 has a plurality of (two in the shown example) IDT electrodes 11 aligned along the direction of propagation of the SAW and a pair of reflectors 13 positioned on the two sides thereof.

In these filters, for example, the passband is made the frequency band where spurious is undesirable, and the thickness $t_s$ of the piezoelectric substrate 7 etc. are set so that the passband is kept in the region surrounded by the curves of three bulk waves (for example lines L21 to L23) on the side where the thickness of the piezoelectric substrate is low and the side where the frequency is low. If the passband is surrounded by three bulk wave curves (for example lines L21 to L23), the resonance frequency and anti-resonance frequency of the resonator 5 (or IDT electrode 11) configuring the filter do not always have to be surrounded by the three bulk wave curves. Note that, in the ladder type SAW filter 205, from the principle of utilization of the resonance frequencies and anti-resonance frequencies of the serial resonators 5 and parallel resonators 5, if the resonance frequencies and anti-resonance frequencies of the serial resonators 5 and parallel resonators 5 are kept in the region surrounded by the three bulk wave curves, the passband is also kept in the region surrounded by the three bulk wave curves.

At least one of the IDT electrodes 11 and resonators 5 used in such a filter will be referred to as the first IDT electrode 11 and first resonator.

In the SAW filter 205, the serial resonators 5 and the parallel resonators 5 differ in resonance frequency from each other and for example differ in the pitch "p" from each other. Between the serial resonators 5, between the parallel resonators 5, or between the IDT electrodes 11 in the SAW filter 305, the resonance frequencies (pitch "p") are basically equal to each other, but the resonance frequencies (consequently pitches "p") sometimes are made different from each other for fine adjustment of the frequency characteristics as the filter as a whole. In a case where the pitch "p" is different among the IDT electrodes 11 (plurality of resonators 5) in this way, the frequencies of bulk waves of various modes shown in FIG. 4A are different among the plurality of IDT electrodes 11. In such a case, for example, for the bulk wave generated by any IDT electrode 11 among the plurality of IDT electrodes 11, the passband may fit in the region surrounded by the curves of three bulk waves (L21 to L23) as well. Otherwise, for the bulk waves generated by two or more and/or all IDT electrodes 11, the passband may fit in the region surrounded by the curves of three bulk waves (L21 to L23) as well (see FIG. 12A and FIG. 12B which will be explained later).

(Duty Ratio in Plurality of Resonators)

An example of setting the duty ratio w/p of the electrode fingers 19 in a case where the SAW element has a plurality of resonators 5 will be explained next. Note that, in the following description, in order to discriminate the plurality of resonators 5 from each other, sometimes an additional notation of a capital letter of the alphabet will be attached to the notation of the resonator 5 such as the "resonator 5A".

(Example 1 of Setting Duty Ratio)

Figure 11A:
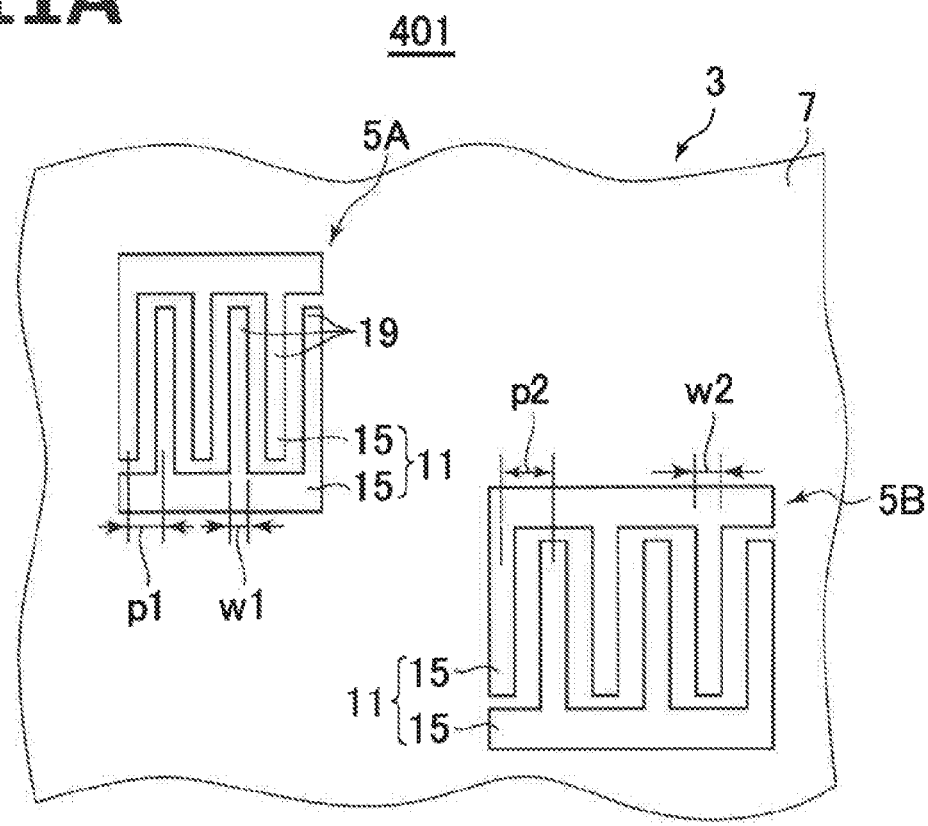
FIG. 11A is a schematic plan view showing a SAW element according to one aspect of the present disclosure.

FIG. 11A is a schematic plan view showing a SAW element 401 according to one aspect of the present disclosure.

The SAW element 401 has a plurality of (two in the diagram) resonators 5A and 5B on the same piezoelectric substrate 7. Note that, in FIG. 11A, illustration of the reflectors 13 etc. is omitted. The resonators 5A and 5B may be serially connected to each other, may be connected in parallel to each other, or may configure signal routes which are independent from each other.

Figure 12A:
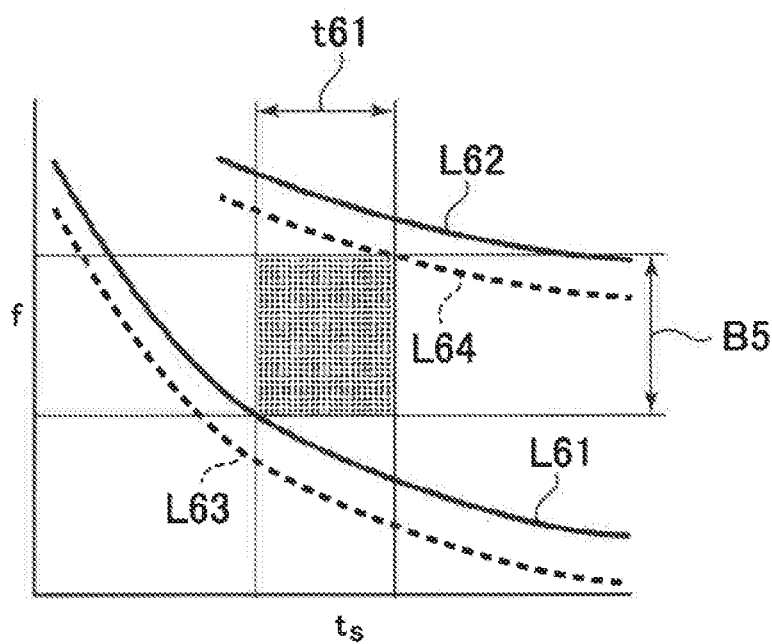
FIG. 12A and FIG. 12B are graphs showing frequency characteristics of bulk waves in the aspects in FIG. 11A and FIG. 11B.

In each resonator 5, for example, the relationships between the resonance frequency and anti-resonance frequency and the frequency of bulk wave explained above stand. Specifically, the resonance frequency and anti-resonance frequency of the resonator 5A are kept between the lowest frequency and the next lowest frequency among the frequencies of the plurality of bulk waves generated by application of voltage to the piezoelectric substrate 7 by the IDT electrode 11 in the resonator 5A. The resonance frequency and anti-resonance frequency of the resonator 5B are kept between the lowest frequency and the next lowest frequency among the frequencies of the plurality of bulk waves generated by application of voltage to the piezoelectric substrate 7 by the IDT electrode 11 in the resonator 5B. Note that, the relationships between the resonance frequency and anti-resonance frequency of the resonator 5A (or 5B), and the frequency of the bulk wave generated by the resonator 5A (or 5B) may be suitably set. An example thereof will be explained later (FIG. 12A).

The resonance frequency of the resonator 5B is set lower than the resonance frequency of the resonator 5A. As already explained, the pitch "p" is basically the half wavelength of the SAW of the frequency at which resonation is to be caused. In the SAW element 401, the difference of resonance frequencies of the resonators 5A and 5B is basically realized by the pitches "p". That is, the pitch p2 of the resonator 5B having a lower resonance frequency than the resonator A is larger than the pitch p1 of the resonator 5A. More specifically, for example, between the resonators 5A and 5B, except for the pitch "p", parameters having relatively large influences upon the resonance frequency are made the same as each other. The ratio of the pitch p1 of the resonator 5A and the pitch p2 of the resonator 5B is made substantially the same as the ratio of resonance frequencies of these resonators 5.

The resonator 5A and the resonator 5B are made the same in duty ratio w/p as each other. That is, when the duty ratio of the resonator 5A is defined as w1/p1 and the duty ratio of the resonator 5B is defined as w2/p2, w1/p1 is equal to w2/p2. The duty ratio is one of the parameters exerting an influence upon the resonance frequency. Specifically, the larger the duty ratio, the lower the resonance frequency.

In this way, when the resonance frequencies (and pitches "p") are different from each other, the plurality of resonators 5 may be given the same duty ratio w/p as each other. In this case, for example, parameters which should be considered in the adjustment of resonance frequency are narrowed, and design is facilitated. Here, the resonator 5A can be regarded as the first resonator.

(Example 2 of Setting Duty Ratio)

Figure 11B:
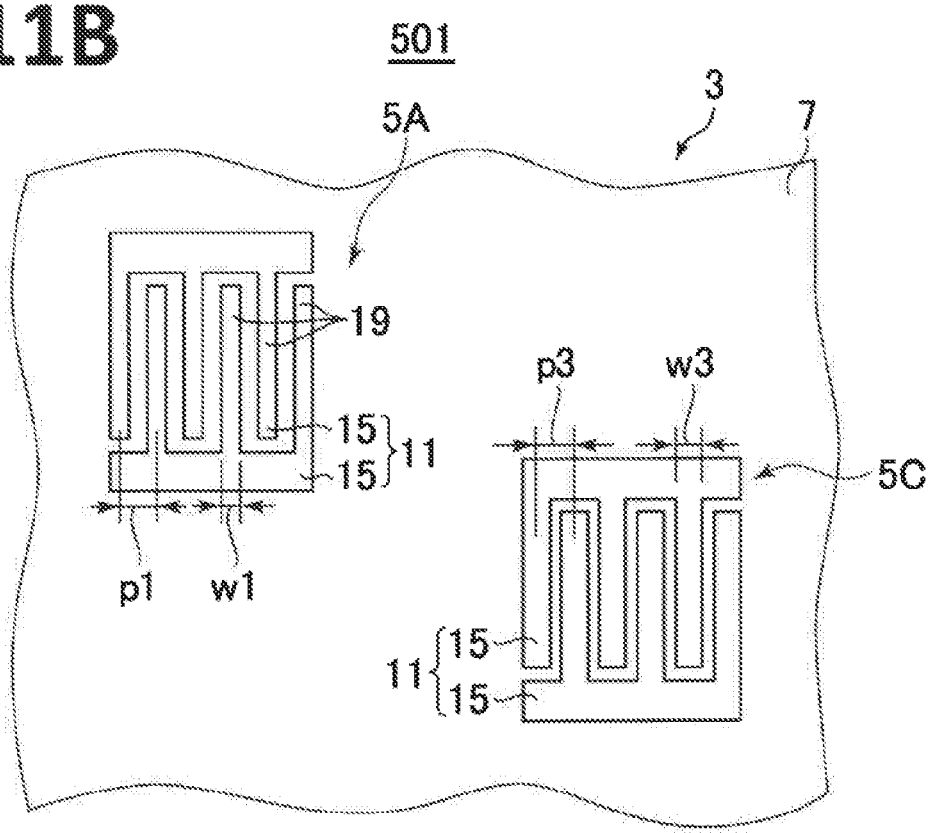
FIG. 11B is a schematic plan view showing a SAW element according to an aspect different from FIG. 11A.

FIG. 11B is a schematic plan view showing a SAW element 501 according to another aspect of the present disclosure.

The SAW element 501 is different from the SAW element 401 only in the point that a resonator 5C is provided in place of the resonator 5B. In the resonator 5C, for example, in the same way as the resonators 5A and 5B, the resonance frequency and anti-resonance frequency thereof are positioned between the lowest frequency and the next lowest frequency among the frequencies of the plurality of bulk waves generated by the resonator 5C.

The resonator 5C is configured so as to have the same resonance frequency as that of the resonator 5B. However, the duty ratio w3/p3 of the resonator 5C is set so as to become larger than the duty ratio w2/p2 of the resonator 5B. From another viewpoint, w2/p2=w1/p1, therefore the resonator 5C having a lower resonance frequency than that of the resonator 5A is larger in its duty ratio w3/p3 than the duty ratio w1/p1 of the resonator 5A.

Further, when the duty ratio is made large, the resonance frequency becomes low as explained above. Accordingly, the pitch p3 of the resonator 5C is made smaller than the pitch p2 of the resonator 5B so that the resonance frequency of the resonator 5C becomes the same as the resonance frequency of the resonator 5B. Note that, compared with the pitch p1 of the resonator 5A, the pitch p3 may be large, equal, or small.

The pitch p3 for example satisfies |p3−p1|<p2−p1. In a case where the SAW element 501 is provided, p1 and p3 are found by measurement. Assuming that the duty ratio of the resonator 5C is made the same as that of the resonator 5A, p2 is found by computation of the pitch for realizing the resonance frequency (for example found by measurement) of the resonator 5C.

The effect when the duty ratio of a resonator having a relatively low resonance frequency is made relatively large as in FIG. 11B is for example as follows.

FIG. 12A is a graph showing the frequency of the bulk wave for the SAW element 401 in FIG. 11A. This graph is the same as FIG. 4A, in which the abscissa indicates the thickness $t_s$ of the piezoelectric substrate 7, and the ordinate indicates the frequency f.

Lines L61 and L62 indicate frequencies of bulk waves generated by the resonator 5A. Lines L63 and L64 indicate frequencies of bulk waves generated by the resonator 5B. The line L61 and the line L63 indicate frequencies of the bulk waves having the lowest frequency and correspond to the line L11 in FIG. 4A. The line L62 and the line L64 indicate frequencies of bulk waves having the next lowest frequency. Here, lines corresponding to the line L13 in FIG. 4A are shown. Note that, even in a case where the line corresponding to the line L12 in FIG. 4A is considered in addition to the line corresponding to the line L13, the basic point of view of the example of the effect which will be explained below is the same.

In the same way as the resonance frequency of the SAW, the larger the pitch "p", the lower the frequency of the bulk wave. Accordingly, the frequency (line L63) of the lowest frequency bulk wave generated by the resonator 5B becomes lower than the frequency (line L61) of the lowest frequency bulk wave generated by the resonator 5A. In the same way, the frequency (line L64) of the next lowest frequency bulk wave generated by the resonator 5B becomes lower than the frequency (line L62) of the next lowest frequency bulk wave generated by the resonator 5A.

Accordingly, a frequency band where neither the frequency of the bulk wave by the resonator 5A, nor that by the resonator 5B is generated ends up being positioned between a higher frequency between the frequencies of the lowest frequency bulk waves (line L61 between the lines L61 and L63) and a lower frequency between the frequencies of the next lowest frequency bulk waves (line L64 between the lines L62 and L64).

As a result, for example, the range t61 of the thickness $t_s$ of the piezoelectric substrate 7 capable of positioning the frequency band B5 where spurious is undesirable between the line L61 and the line L64 becomes narrower compared with the case where there is only one resonator 5 (for example a case where the frequency band B5 is positioned between the line L61 and the line L62). Further, when considering the case where the thickness $t_s$ of the piezoelectric substrate 7 is set to a predetermined value, a difference between the frequency band B5 and the frequency of spurious becomes smaller.

Figure 12B:
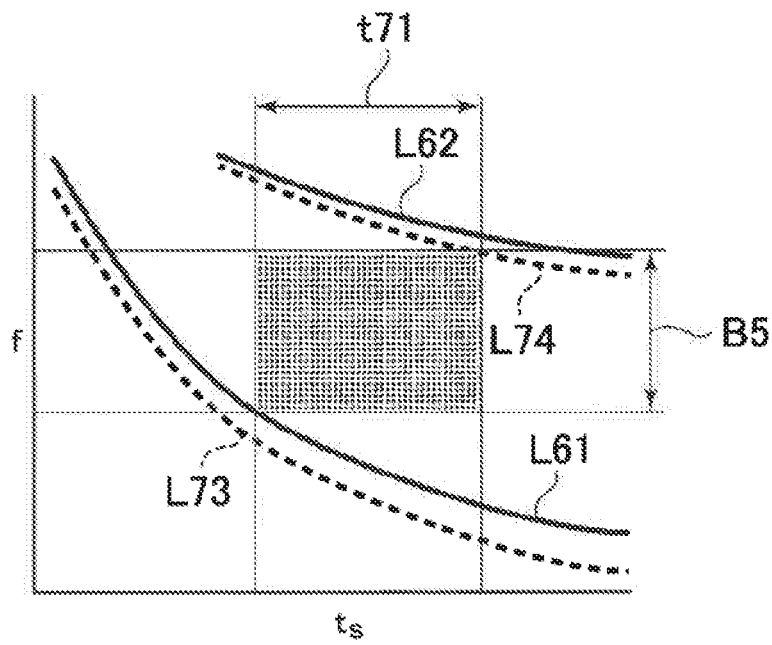

FIG. 12B is the same graph as FIG. 12A and shows frequencies of bulk waves for the SAW element 501 in FIG. 11B.

In the SAW element 501, the resonator 5C is provided in place of the resonator 5B of the SAW element 401. Therefore, in FIG. 12B, in place of the lines L63 and L64 in FIG. 12A, lines L73 and L74 indicating the frequencies of the bulk waves generated by the resonator 5C are drawn. That is, the lines L73 and L74 indicate the frequencies of the lowest frequency bulk wave and the next lowest frequency bulk wave which are generated by the resonator 5C.

If the duty ratio w/p of the electrode fingers 19 is made larger, as explained above, the resonance frequency of the SAW becomes lower. On the other hand, the frequency of the bulk wave does not change so much. Further, when the pitch "p" of the electrode fingers 19 is made smaller, in the same way as the resonance frequency of SAW, the frequency of the bulk wave also becomes higher. Here, in the resonator 5C, the pitch "p" is made smaller compared with the resonator 5B. Accordingly, the lines L73 and L74 are positioned on a higher frequency side than the lines L63 and L64. From another viewpoint, the lines L73 and L74 approach the lines L61 and L62.

As a result, for example, the range t71 of the thickness $t_s$ of the piezoelectric substrate 7 capable of positioning the frequency band B5 where spurious is undesirable between the frequencies of the bulk waves of the two resonators 5 becomes broader than the range t61 in FIG. 12A. Further, when considering the case where the thickness $t_s$ of the piezoelectric substrate 7 is set at the predetermined value, compared with FIG. 12A, the difference between the frequency band B5 and the frequency of the spurious becomes larger.

From another viewpoint, when it trying to make the pitch p2 of the resonator 5B larger in order to make the resonance frequency of the resonator 5B lower, by making the pitch p2 larger, the frequency of the next lowest frequency bulk wave generated by the resonator 5B (see the line L64) becomes lower. As a result, the frequency of the bulk wave approaches the frequency band B5 where spurious is undesirable or is positioned in the frequency band B5. As a result, it becomes difficult to realize the resonance frequency which is demanded from the resonator 5B. However, in place of or addition to making the pitch "p" large, by shifting the resonance frequency to a low frequency side by the duty ratio w/p, it is made easier to realize the resonance frequency demanded from the resonator 5B (5C).

Note that, the resonance frequencies and anti-resonance frequencies of the resonators 5A and 5C (or 5B) are for example positioned in the frequency band B5. However, just the resonance frequency and anti-resonance frequency of one of the resonator 5A or 5C (or 5B) may be positioned in the frequency band B5, or just the relationships explained with reference to FIG. 5 etc. may stand in each of the resonators 5 without considering the bulk waves generated by a plurality of resonators 5.

As described above, in the example in FIG. 11B, the resonance frequency of the resonator 5C is lower than the resonance frequency of the resonator 5A (the resonance frequency of the IDT electrode 15 in the resonator 5C is lower than the resonance frequency of the IDT electrode 15 in the resonator 5A), and the duty ratio of the IDT electrode 15 in the resonator 5C is larger than the duty ratio of the IDT electrode 15 in the resonator 5A. And/or the pitch p3 of the IDT electrode 15 in the resonator 5C is larger than the pitch p1 of the IDT electrode 15 in the resonator 5A, and the duty ratio of the IDT electrode 15 in the resonator 5C is larger than the duty ratio of the IDT electrode 15 in the resonator 5A.

Accordingly, for example, as explained with reference to FIG. 12A and FIG. 12B, it is made easier to set the frequency band B5 capable of avoiding the frequency of the bulk wave by any of the resonators 5A and 5B. Further, for example, a resonance frequency which is relatively low can be realized in the resonator 5C while reducing the chance of generation of a bulk wave spurious in the frequency band 5B where bulk wave spurious is undesirable. That is, the resonator 5C can be deemed as the second resonator.

Note that, in the above description, the relationships of magnitude of the resonance frequency (and/or pitch) and duty ratio between the two resonators 5 were explained. In a case where the SAW element has three or more resonators 5, the relationships of magnitude of the resonance frequency (and/or pitch) and duty ratio in FIG. 11A or FIG. 11B may stand only for any two among three or more resonators 5 or may stand among three or more resonators 5.

For example, among three of more resonators 5, the resonator 5 having a lower resonance frequency (and/or larger pitch) may have a larger duty ratio. In this case, for example, the resonator 5 having the highest resonance frequency may be made the resonator 5A, the resonator 5 having the lowest resonance frequency may be made the resonator 5C, and |p3−p1|<p2−p1 may be satisfied.

Unlike the example in FIG. 11A and FIG. 11B, in a case where the SAW element has only one resonator 5 or a case where attention is paid to only one resonator 5, the adjustment of relative relationships between the resonance frequency and anti-resonance frequency and the frequency of the bulk wave may be carried out by the adjustment of duty ratio as well.

Further, the example of setting the pitch "p" and duty ratio w/p explained with reference to FIG. 11A and FIG. 11B may be applied to the IDT electrode 11 other than the resonator 5 as well. For example, in a multiplex mode type SAW filter 305, when the resonance frequencies and/or pitches are different from each other among the plurality of IDT electrodes 11, the IDT electrode 11 having a lower resonance frequency (and/or larger pitch) may have a larger duty ratio.

In a case where the example of setting the pitch "p" and duty ratio w/p explained with reference to FIG. 11A and FIG. 11B is applied to the SAW filter 205 or SAW filter 305, for example, as already explained, the passband may be kept between the frequencies of two or more bulk waves which are generated by one, two or more, or all of the plurality of IDT electrodes 11 (resonators 5). The resonance frequency and anti-resonance frequency do not always have to fit between the frequencies of two or more bulk waves for individual IDT electrodes 11.

(Addition of Inductor, Additional Example 1)

Figure 13A:
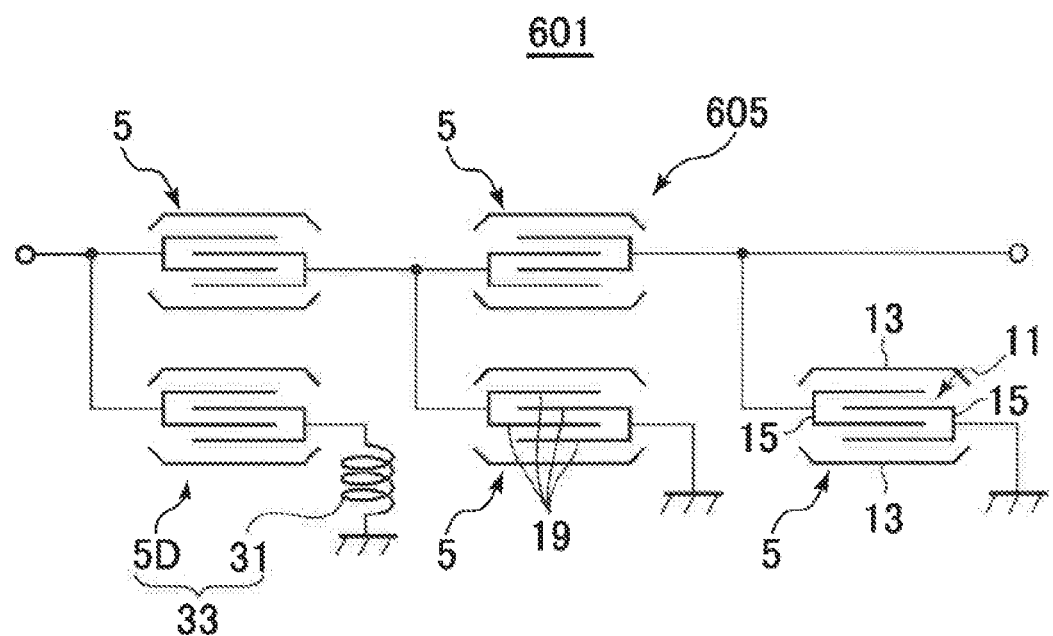
FIG. 13A is a schematic plan view showing a SAW element according to an aspect of the present disclosure.

FIG. 13A is a schematic plan view showing a SAW element 601 (SAW filter 605) according to an aspect of the present disclosure.

As will be understood from a comparison with FIG. 10A, the SAW element 601 differs from the SAW element 401 in FIG. 10A only in the point that an inductor 31 connected in series to the parallel resonator 5D is provided between the parallel resonator 5D and the reference potential portion.

Note that, as is well known, in a ladder type filter, the frequency characteristics of the serial resonator 5 and the parallel resonator 5 are basically set so that the resonance frequency of the serial resonator 5 and the anti-resonance frequency of the parallel resonator 5 coincide. Accordingly, the resonance frequency of the parallel resonator 5 (including 5D) is lower than the resonance frequency of the serial resonator. This is true also for the anti-resonance frequency.

The parallel resonator 5D, for example, should be made the lowest resonance frequency among all parallel resonators 5 in the SAW filter 605 in a case where the inductor 31 is not provided. In the shown example, the parallel resonator 5 which is nearest the terminal is defined as the parallel resonator 5D. However, the parallel resonator 5 at another position may be defined as the parallel resonator 5D as well.

By connecting the inductor 31 in series to the parallel resonator 5D, the resonance frequency (and anti-resonance frequency) of the resonator 33 including the parallel resonator 5D and inductor 31 become lower than the resonance frequency of just the parallel resonator 5D. Accordingly, compared with the case where the inductor 31 is not provided, the pitch "p" of the parallel resonator 5D can be made smaller.

Further, for example, in the SAW filter 605, the resonance frequency and anti-resonance frequency of the resonator 33 are set so that the resonator 33 functions as a parallel resonator. For example, not the anti-resonance frequency of the parallel resonator 5D, but the anti-resonance frequency of the resonator 33 substantially coincides with the resonance frequency of the serial resonator 5.

Note that, the pitch "p" of the parallel resonator 5D which is made smaller may be larger, equal, or smaller relative to the pitch "p" of the other parallel resonator 5 (or pitch "p" of the serial resonator 5). In the same way as the adjustment of duty ratio, |p3−p1|<p2−p1 may be satisfied as well. Here, p3 is the pitch of the parallel resonator 5D. p2 is the pitch of the parallel resonator 5 by which the same resonance frequency as that of the resonator 33 is realized when assuming that the inductor 31 is not provided. p1 is for example either of the pitch "p" of any of the other parallel resonators 5 (for example the pitch of the parallel resonator 5 having the smallest pitch) or the pitch "p" of any of the plurality of serial resonators 5 (for example the pitch of the serial resonator 5 having the smallest pitch).

As described above, the resonance frequency of the resonator 33 as the second resonator is lower than the resonance frequency of the parallel resonator 5 (other than 5D) or serial resonator 5 as the first resonator. Only the second resonator between the first resonator and the second resonator has the inductor 31 connected in series to the IDT electrode 11. Otherwise, the pitch "p" of the resonator 33 serving as the second resonator is lower than the pitch "p" of the parallel resonator 5 (other than 5D) or serial resonator 5 serving as the first resonator, and only the second resonator between the first resonator and the second resonator has the inductor 31 connected in series to the IDT electrode 11.

Here, even if the inductor 31 is added, the frequency of the bulk wave basically does not change. On the other hand, when the pitch "p" of the parallel resonator 5D is made small, the frequency of the bulk wave generated by the parallel resonator 5D becomes higher. Accordingly, for example, by adding the inductor 31, the same effect as that at the time when the duty ratio is made larger can be obtained. For example, as explained with reference to FIG. 12A and FIG. 12B, the range t71 capable of positioning the frequency band B5 between the frequencies of the bulk waves can be made large. Further, for example, realization of the relatively low resonance frequency demanded from the resonator 33 is facilitated.

Note that, as understood from the explanation of the SAW element 601, in the present disclosure, when referring to the "resonance frequency" and "anti-resonance frequency" of the resonator, unless indicated otherwise, the resonance frequency and anti-resonance frequency of the resonator as a whole are designated. Specifically, for example, as in the resonator 33, in the case where an adjustment element for adjusting impedance is connected to the IDT electrode 11, and the IDT electrode 11 and the adjustment element function as the resonator as a whole, the resonance frequency and anti-resonance frequency of the resonator designate the resonance frequency and anti-resonance frequency of the IDT electrode 11 and adjustment element as a whole. Further, for example, where such an adjustment element is not connected, the resonance frequency and anti-resonance frequency of the resonator designate the resonance frequency and anti-resonance frequency of the IDT electrode 11 (and reflectors 13) themselves. Note that, as the adjustment element, for example, other than the inductor 31, a capacitor connected to the IDT electrode 11 in parallel can be mentioned although it is particularly not shown.

In the SAW element 601, in the same way as the SAW element 401, the passband may be kept between the frequencies of the two or more bulk waves which are generated by one, two or more, or all of the plurality of IDT electrodes 11 (resonators 5 including 5D). Accordingly, for individual resonators (33 or 5 except 5D), the resonance frequency and anti-resonance frequency may fit or may not fit between the frequencies of the two or more bulk waves generated by one, two or more, or all of the plurality of IDT electrodes 11 (resonators 5 including 5D). As an example, in all resonators (33 or 5 except 5D), their resonance frequencies and anti-resonance frequencies are positioned between the frequencies of the two or more bulk waves generated by their own IDT electrodes 11.

Additional Example 2 of Inductor

Figure 13B:
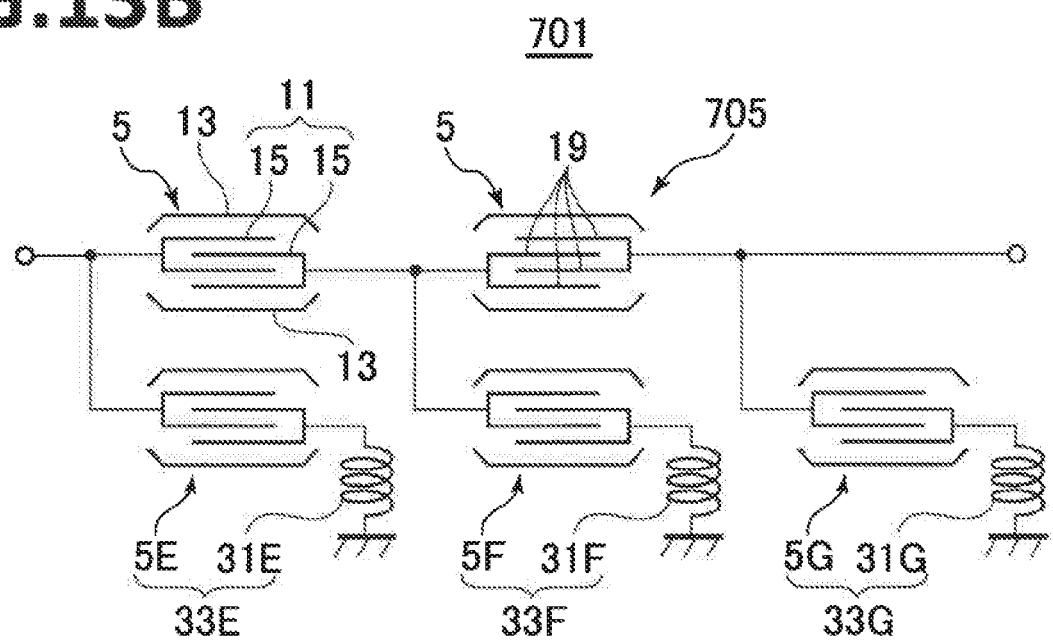
FIG. 13B is a schematic plan view showing a SAW element according to an aspect different from FIG. 13A.

FIG. 13B is a schematic plan view showing a SAW element 701 (SAW filter 705) according to an aspect of the present disclosure.

As understood from a comparison with FIG. 13A, the SAW element 701 differs from the SAW element 601 in FIG. 13A only in the point that inductors 31 are provided for the plurality of parallel resonators 5D (all parallel resonators 5 in the shown example).

In all of the parallel resonators 5E to 5G, in the same way as the parallel resonator 5D in FIG. 13A, resonators 33E to 33G substantially functioning as parallel resonators are configured by combinations of the inductors 31E to 31G connected in series to the IDT electrodes 11.

Among the plurality of resonators 33E to 33G (or resonators 5E to 5G), the resonance frequencies and/or pitches may be the same as each other or may be different from each other. In any case, by resonators 33 having lower resonance frequencies than the serial resonators 5 or having larger pitches "p" than the serial resonators 5 even if inductors 31 is provided being provided with inductors 31, for example, the same effect as the effect by provision of the inductor 31 in the resonator 33 in FIG. 13A is exerted.

Note that, the pitches of the parallel resonators 33E to 33G made smaller by provision of the inductors 31 may be larger than, equal to, or smaller than the pitches of the serial resonators 5. Among the plurality of resonators 33E to 33G, when defining the pitch of any one of the resonators 33 or the one having the largest pitch (or largest difference from the pitch p1) as p3, |p3−p1|<p2−p1 may be satisfied as well. Here, p1 is for example the pitch of the resonator 5 having the smallest pitch (usually the serial resonator 5). p2 is for example the pitch of the parallel resonator 5 by which the same resonance frequency as that of the resonator 33 having the pitch p3 is realized when assuming that the inductor 31 is not provided in the resonator 33 having the pitch p3.

In a case where the resonance frequencies (and/or pitches) of the plurality of resonators 33 are different from each other, for example, for at least two resonators 33 (first resonator, second resonator), relationships where the inductance of the inductor 31 (second inductor) in the resonator 33 (second resonator) on the side where the resonance frequency is lower (and/or the side where the pitch is larger) is larger may stand. Note that, the inductor 31 on the side connected to the first resonator can be deemed as the first inductor.

Further, among three or more resonators 33, the inductance of the inductor 31 may become larger as the resonance frequency becomes lower (and/or the pitch becomes larger). Further, from another viewpoint, for example, the inductor 31 of the resonator 33 having the lowest resonance frequency (and/or the largest pitch) may have the largest inductance as well.

In this way, by adjusting the magnitude of the inductance of the inductor 31, the same effect as that in the case where the inductor is connected for only the resonator 5 in a portion in FIG. 13A is exerted. For example, the difference of pitch "p" is reduced among the plurality of resonators 33. Therefore, as explained with reference to FIG. 12A and FIG. 12B, the range t71 capable of positioning the frequency band B5 between the frequencies of the bulk waves can be made larger. Further, for example, realization of a relatively low resonance frequency demanded from the resonator 33 is facilitated.

Note that, in the SAW element 701, in the same way as the SAW element 601, the passband may be kept between the frequencies of the two or more bulk waves generated by one, two or more, or all of the plurality of IDT electrodes 11 (resonators 5 including 5E to 5G). Accordingly, for the individual resonators (33 or 5 except 5E to 5G), the resonance frequency and anti-resonance frequency may fit or may not fit between the frequencies of the two or more bulk waves generated by one, two or more, or all of the plurality of IDT electrodes 11 (resonators 5 including 5E to 5G). As an example, in all of the resonators (33 or 5 except 5E to 5G), their resonance frequencies and anti-resonance frequencies are positioned between the frequencies of the two or more bulk waves generated by their own IDT electrodes 11.

Unlike the examples in FIG. 13A and FIG. 13B, in a case where the SAW element has only one resonator 5 or a case where attention is paid to only one resonator 5, the relative relationships between the resonance frequency and anti-resonance frequency and the frequency of the bulk wave may also be adjusted by addition of the inductor 31.

(Multiplexer)

The filter as explained above may be applied to a multiplexer as well. The multiplexer has a function of branching a signal of the transmission frequency and a signal of the reception frequency in a communication apparatus.

In the communication apparatus, a transmitting information signal TIS including the information to be transmitted is modulated and boosted up in frequency (converted to a high frequency signal having carrier wave frequency) by the RF-IC to become the transmission signal TS. The transmission signal TS is amplified by an amplifier and is input to the multiplexer. The multiplexer removes unwanted components other than the transmission-use passband from the input transmission signal TS and outputs the result to an antenna. The antenna converts the input electrical signal (transmission signal TS) to a radio signal and transmits the result.

In the same way, in the communication apparatus, the radio signal received by the antenna is converted to an electrical signal (reception signal RS) by the antenna and is input to the multiplexer. The multiplexer removes unwanted components other than the reception-use passband from the input reception signal RS and outputs the result to the amplifier. The output reception signal RS is amplified by the amplifier and is boosted down in frequency and demodulated by the RF-IC to become the reception information signal RIS.

The transmitting information signal TIS and the reception information signal RIS may be low frequency signals (baseband signals) containing suitable information and are for example analog audio signals or digital audio signals. The passband of the radio signal may be one according to various standards such as the UMTS (Universal Mobile Telecommunications System). The modulation scheme may be either of phase modulation, amplitude modulation, frequency modulation, or a combination of two or more selected from among them.

Such a multiplexer includes a filter for reception and a filter for transmission. The filter explained above may be used for at least one of them.

Note that, the art according to the present disclosure is not limited to the above embodiments and may be worked in various ways.

The SAW element is not limited to one having a SAW resonator and resonator type filter. For example, the SAW element may be one having a transversal type filter as well.

The shape of the IDT electrode is not limited to the shown ones. For example, the IDT electrode may be one not having dummy electrodes as well. Further, for example, the IDT electrode may be a so-called apodized one in which the length of the electrode finger etc. change in the direction of propagation of SAN. The bus bar may be inclined relative to the direction of propagation of the SAW as well.

In the embodiments, the explanation was made of the thickness of the electrode (IDT electrode and reflector) being made thicker than the thickness considered to have a good excitation efficiency, but the thickness of the electrode may be made thinner than the thickness which is considered to have a good excitation efficiency as well.

As the method of adjusting the relative relationships between the resonance frequency or anti-resonance frequency of the resonator or the passing characteristic of the filter and the frequency of the bulk wave, the explanation was given of adjustment of the thickness of the piezoelectric substrate, adjustment of the thickness of the electrode, adjustment of the duty ratio, and addition of an inductor. Two or more among them may be combined as well. Further, for example, other parameters may be adjusted as well.

REFERENCE SIGNS LIST

1 . . . SAW element (surface acoustic wave element), 3 . . . bonded substrate, 5 . . . resonator, 7 . . . piezoelectric substrate, 9 . . . support substrate, and 11 . . . IDT electrode.

The invention claimed is:

1. A surface acoustic wave element comprising:
a piezoelectric substrate having a thickness,
a support substrate attached directly or indirectly to a bottom surface of the piezoelectric substrate, and
a first resonator comprising a first IDT electrode on a top surface of the piezoelectric substrate, the first IDT electrode having electrode fingers with a pitch and a thickness, wherein
the thickness of the piezoelectric substrate, the pitch of electrode fingers of the first IDT electrode and the thickness of the electrode fingers have a relationship where a normalized thickness $t_s/2p$ of the piezoelectric substrate is 1 to 3 wherein "p" represents the pitch of the electrode fingers in the first IDT electrode and $t_s$ represents the thickness of the piezoelectric substrate, and a normalized thickness $t_e/2p$ of the electrode finger is 0.080 or more wherein "p" represents the pitch of the electrode fingers in the first IDT electrode and $t_e$ represents the thickness of the electrode fingers so that a resonance frequency and an anti-resonance frequency of the first resonator are kept between a lowest frequency and a next lowest frequency among frequencies of a plurality of bulk wave spuriouses generated by the first resonator.

2. A surface acoustic wave element comprising:
a piezoelectric substrate having a thickness,
a support substrate attached directly or indirectly to a bottom surface of the piezoelectric substrate, and
a filter comprising a first IDT electrode on a top surface of the piezoelectric substrate, the first IDT electrode having electrode fingers with a pitch and a thickness, wherein
the thickness of the piezoelectric substrate, the pitch of electrode fingers of the first IDT electrode and the thickness of the electrode fingers have a relationship where a normalized thickness $t_s/2p$ of the piezoelectric substrate is 1 to 3 wherein "p" represents the pitch of the electrode fingers in the first IDT electrode and $t_s$ represents the thickness of the piezoelectric substrate, and a normalized thickness $t_e/2p$ of the electrode finger is 0.080 or more wherein "p" represents the pitch of the electrode fingers in the first IDT electrode and $t_e$ represents the thickness of the electrode fingers so that a passband of the filter is kept between a lowest frequency and a next lowest frequency among frequencies of a plurality of bulk wave spuriouses generated by the first IDT electrode.

3. The surface acoustic wave element according to claim 1, wherein the thickness of the piezoelectric substrate, the pitch of electrode fingers of the first IDT electrode and the thickness of the electrode fingers have a relationship where the bulk wave spurious having the lowest frequency and the bulk wave spurious having the next lowest frequency are the same in a mode relating to the vibration direction as each other and are different in a mode relating to the order from each other.

4. The surface acoustic wave element according to claim 1, wherein the bulk wave spurious having the lowest frequency and the bulk wave spurious having the next lowest frequency are different in the mode relating to the vibration direction from each other.

5. The surface acoustic wave element according to claim 1, wherein the piezoelectric substrate is a single crystal substrate made of lithium tantalite, and is a Y-plate having a cut angle of 38° to 48°.

6. The surface acoustic wave element according to claim 1, wherein the piezoelectric substrate is a single crystal substrate made of lithium tantalate.

7. The surface acoustic wave element according to claim 6, wherein the piezoelectric substrate is a Y-plate having a cut angle of 38° to 48°.

8. The surface acoustic wave element according to claim 1,
further comprising a second resonator comprising a second IDT electrode on the top surface of the piezoelectric substrate, wherein
a resonance frequency of the second resonator is lower than the resonance frequency of the first resonator, and
a duty ratio of the second IDT electrode is larger than a duty ratio of the first IDT electrode.

9. The surface acoustic wave element according to claim 1,
further comprising a second resonator comprising a second IDT electrode on the top surface of the piezoelectric substrate, wherein
a resonance frequency of the second resonator is lower than the resonance frequency of the first resonator, and
only the second resonator, of the first resonator and the second resonator, comprises an inductor connected in series to the second IDT electrode.

10. The surface acoustic wave element according to claim 1,
further comprising a second resonator comprising a second IDT electrode on the top surface of the piezoelectric substrate, wherein
the resonance frequency of the second resonator is lower than the resonance frequency of the first resonator,
the first resonator comprises a first inductor connected in series to the first IDT electrode,
the second resonator comprises a second inductor connected in series to the second IDT electrode, and
the second inductor is larger in inductance than the first inductor.

11. The surface acoustic wave element according to claim 1,
further comprising a second IDT electrode on the top surface of the piezoelectric substrate, wherein
a resonance frequency of the second IDT electrode is lower than a resonance frequency of the first IDT electrode, and a duty ratio of the second IDT electrode is larger than a duty ratio of the first IDT electrode.

12. The surface acoustic wave element according to claim 2, further comprising:
a first resonator comprising the first IDT electrode and
a second resonator including a second IDT electrode on the top surface of the piezoelectric substrate, wherein
a resonance frequency of the second resonator is lower than the resonance frequency of the first resonator, and
a duty ratio of the second IDT electrode is larger than a duty ratio of the first IDT electrode.

13. The surface acoustic wave element according to claim 2, further comprising:
a first resonator comprising the first IDT electrode and
a second resonator including a second IDT electrode on the top surface of the piezoelectric substrate, wherein
a resonance frequency of the second resonator is lower than the resonance frequency of the first resonator, and
the second resonator comprises an inductor connected in series to the second IDT electrode, and the first resonator comprises no inductor connected in series to the first IDT electrode.

14. The surface acoustic wave element according to claim 2, further comprising:
a first resonator comprising the first IDT electrode and
a second resonator including a second IDT electrode on the top surface of the piezoelectric substrate, wherein
a resonance frequency of the second resonator is lower than the resonance frequency of the first resonator,
the first resonator comprises a first inductor connected in series to the first IDT electrode,
the second resonator comprises a second inductor connected in series to the second IDT electrode, and
the second inductor is larger in inductance than the first inductor.

15. The surface acoustic wave element according to claim 5, wherein a normalized thickness $t_e/2p$ of the electrode finger is 0.080 or more wherein "p" represents the pitch of the electrode fingers in the first IDT electrode and $t_e$ represents the thickness of the electrode fingers.

16. The surface acoustic wave element according to claim 5, further comprising:
a first resonator comprising the first IDT electrode and
a second resonator including a second IDT electrode on the top surface of the piezoelectric substrate, wherein
a resonance frequency of the second resonator is lower than the resonance frequency of the first resonator, and
a duty ratio of the second IDT electrode is larger than a duty ratio of the first IDT electrode.

17. The surface acoustic wave element according to claim 5, further comprising:
a first resonator comprising the first IDT electrode and
a second resonator including a second IDT electrode on the top surface of the piezoelectric substrate, wherein
a resonance frequency of the second resonator is lower than the resonance frequency of the first resonator, and
only the second resonator, of the first resonator and the second resonator, comprises an inductor connected in series to the second IDT electrode.

18. The surface acoustic wave element according to claim 5 further comprising:
a first resonator comprising the first IDT electrode and
a second resonator including a second IDT electrode on the top surface of the piezoelectric substrate, wherein
a resonance frequency of the second resonator is lower than the resonance frequency of the first resonator,
the first resonator comprises a first inductor connected in series to the first IDT electrode,
the second resonator comprises a second inductor connected in series to the second IDT electrode, and
the second inductor is larger in inductance than the first inductor.

* * * * *